US012731653B2

(12) United States Patent
Kim et al.

(10) Patent No.: US 12,731,653 B2
(45) Date of Patent: Sep. 8, 2026

(54) NON-VOLATILE MEMORY SYSTEM AND DATA RECOVER READ OPERATION METHOD THEREOF

(71) Applicant: SAMSUNG ELECTRONICS CO., LTD., Suwon-si (KR)

(72) Inventors: JunHo Kim, Suwon-si (KR); Sangjin Yoo, Suwon-si (KR); Kwangwoo Lee, Suwon-si (KR); Jeongwoo Lee, Suwon-si (KR); Heewon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 18/762,272

(22) Filed: Jul. 2, 2024

(65) Prior Publication Data

US 2025/0104784 A1 Mar. 27, 2025

(30) Foreign Application Priority Data

Sep. 25, 2023 (KR) ........................ 10-2023-0128582

(51) Int. Cl.
*G11C 16/26* (2006.01)
*G11C 16/34* (2006.01)
*G11C 29/52* (2006.01)

(52) U.S. Cl.
CPC ............ *G11C 16/349* (2013.01); *G11C 16/26* (2013.01); *G11C 29/52* (2013.01)

(58) Field of Classification Search
CPC ....... G11C 16/349; G11C 16/26; G11C 29/52; G11C 16/08; G11C 16/10; G06F 3/0658; G06F 3/0679
See application file for complete search history.

(56) References Cited

U.S. PATENT DOCUMENTS

| | | | | |
|---|---|---|---|---|
| 7,606,084 | B2 | 10/2009 | Kamei | |
| 10,580,486 | B2 | 3/2020 | Kim et al. | |
| 10,998,041 | B1 | 5/2021 | Avraham et al. | |
| 11,335,423 | B2 | 5/2022 | Cha et al. | |
| 11,495,291 | B2 | 11/2022 | Kim | |
| 11,670,387 | B2 | 6/2023 | Seo et al. | |
| 2018/0294036 | A1* | 10/2018 | Oh | G11C 29/50004 |
| 2021/0366539 | A1* | 11/2021 | Kim | G11C 29/021 |
| 2022/0020433 | A1* | 1/2022 | Seo | G11C 16/3404 |
| 2022/0214826 | A1 | 7/2022 | Seo et al. | |
| 2023/0142279 | A1 | 5/2023 | Park et al. | |

* cited by examiner

*Primary Examiner* — Mohammed A Bashar
(74) *Attorney, Agent, or Firm* — Sughrue Mion, PLLC

(57) ABSTRACT

A data recover read (DRR) operation method of a nonvolatile memory system includes: performing a first read operation on adjacent memory cells, which are connected to an adjacent wordline adjacent to a target wordline, based on a first specific read level; obtaining a cell count value for the adjacent wordline; determining offset values for a normal read level of target memory cells, which are connected to the target wordline, based on the cell count value for the adjacent wordline; and performing a second read operation on the target memory cells, based on the determined offset values and a result of the first read operation.

18 Claims, 17 Drawing Sheets

| | BL1 | BL2 | BL3 | BL4 | ····· |
|---|---|---|---|---|---|
| Group of WL(n) | GR2 | GR1 | GR1 | GR2 | ····· |
| Result of first read operation on WL(n-1) | 1 | 0 | 0 | 1 | ····· |

| Cell count value(=x) | GR1 offset(mV) | GR 2 offset(mV) |
|---|---|---|
| 1000<x<3000 | -10 | +10 |
| 3000≤x<5000 | -15 | +15 |
| ⋮ | ⋮ | ⋮ |

FIG. 7B 221-2

| Cell count value(=x) | | DRR group | GR 1 offset(mV) | GR 2 offset(mV) | GR 3 offset(mV) | GR 4 offset(mV) |
|---|---|---|---|---|---|---|
| 1000<x<3000 | 1000<x<2000 | 2GR | -10 | +10 | - | - |
| | 2000≤x<3000 | 4GR | -10 | -8 | +8 | +9 |
| 3000≤x<5000 | 3000≤x<4000 | 2GR | -15 | +15 | - | - |
| | 4000≤x<5000 | 4GR | -15 | -10 | +10 | +13 |
| ⋮ | ⋮ | ⋮ | ⋮ | ⋮ | ⋮ | ⋮ |

FIG. 7C 221-3

| Cell count value(=x) | | P/E cycle(=y) | WL location | Temp.(=z)(°C) | DRR group | GR 1 offset(mV) | GR 2 offset(mV) | GR 3 offset(mV) | GR 4 offset(mV) |
|---|---|---|---|---|---|---|---|---|---|
| 1000<x<3000 | 1000<x<2000 | 100<y<300 | WL(100)-WL(199) | z<100 | 2GR | -10 | +10 | - | - |
| | 2000≤x<3000 | | | | 4GR | -10 | -8 | +8 | +9 |
| 3000≤x<5000 | 3000≤x<4000 | 300≤y<500 | WL(0)-WL(99) | 100≤z<200 | 2GR | -15 | +15 | - | - |
| | 4000≤x<5000 | | | | 4GR | -15 | -10 | +10 | +13 |
| ⋮ | ⋮ | ⋮ | ⋮ | ⋮ | ⋮ | ⋮ | ⋮ | ⋮ | ⋮ |

FIG. 10

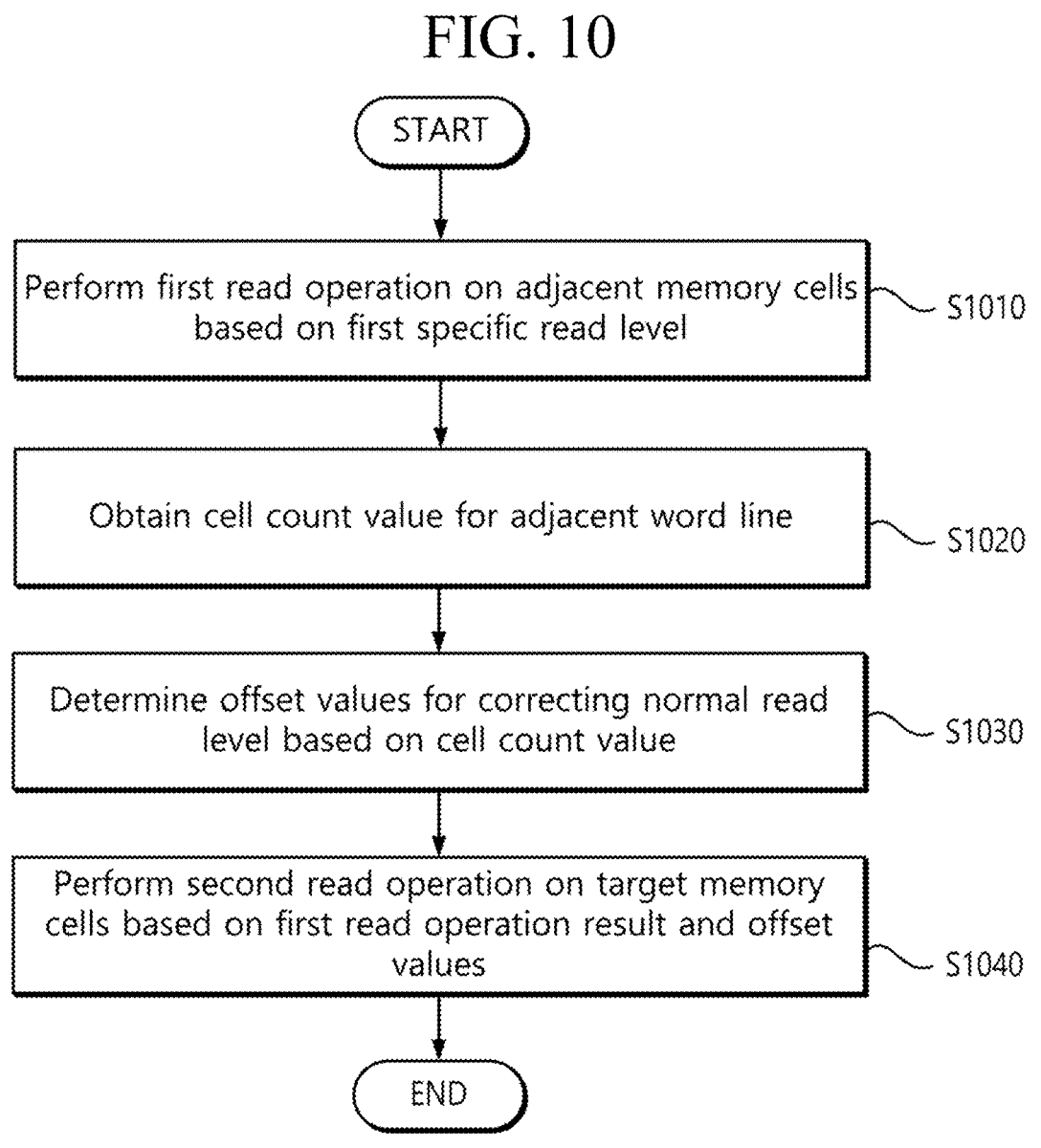

START

Perform first read operation on adjacent memory cells based on first specific read level — S1010

Obtain cell count value for adjacent word line — S1020

Determine offset values for correcting normal read level based on cell count value — S1030

Perform second read operation on target memory cells based on first read operation result and offset values — S1040

END

FIG. 11

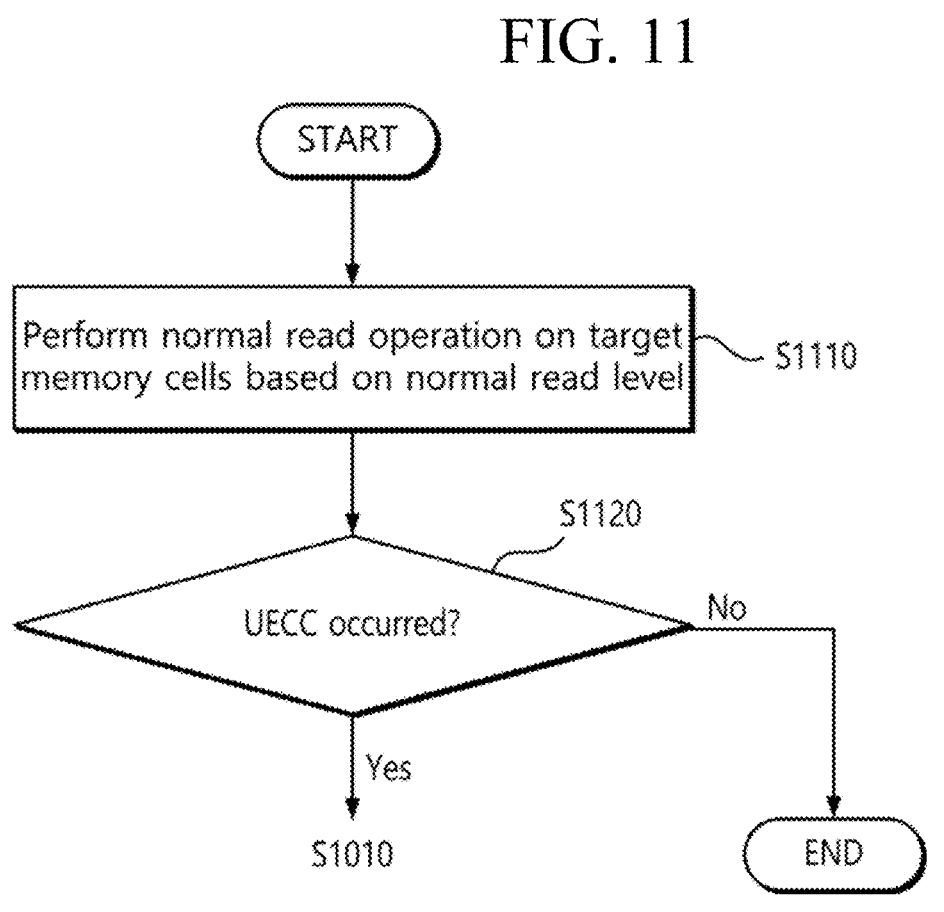

START

Perform normal read operation on target memory cells based on normal read level — S1110

S1120: UECC occurred?

Yes → S1010

No → END

FIG. 15B 221-4

| cell count value of WL(n-1) (=x) | . . . | GR1(n-1)+GR1(n+1) offset(mV) | GR1(n-1)+GR2(n+1) offset(mV) | GR2(n-1)+GR1(n+1) offset(mV) | GR2(n-1)+GR2(n+1) offset(mV) |
|---|---|---|---|---|---|
| $1000<x<3000$ | ⋮ | -9 | +9 | -8 | +10 |
| $3000 \leq x<5000$ | | -15 | +13 | -14 | +14 |
| ⋮ | | ⋮ | ⋮ | ⋮ | ⋮ |

NON-VOLATILE MEMORY SYSTEM AND DATA RECOVER READ OPERATION METHOD THEREOF

CROSS-REFERENCE TO THE RELATED APPLICATION(S)

This application claims priority under 35 USC § 119 to Korean Patent Application No. 10-2023-0128582, filed on Sep. 25, 2023, in the Korean Intellectual Property Office, the disclosure of which is herein incorporated by reference in its entirety.

BACKGROUND

Example embodiments relate to a nonvolatile memory system and a data recovery read operation method thereof.

Semiconductor memory devices may be classified into volatile memory devices and nonvolatile memory devices. Volatile memory devices read and write data at high speed, but lose their stored data when their power supplies are interrupted. Nonvolatile memory devices retain their stored data even when their power supplies are interrupted. Therefore, nonvolatile memory devices may be used in the cases in which data needs to be retained regardless of their power supplies.

In general, a nonvolatile memory system generates an error correction code (ECC) using an ECC circuit for data to be stored in a nonvolatile memory device in a write operation, and corrects errors in data read from the nonvolatile memory device in a read operation using the ECC circuit based on the ECC. However, in some cases, errors are uncorrectable by the ECC circuit due to severe deterioration of memory cells. In such cases, the nonvolatile memory device may execute various defense codes to correct the errors.

SUMMARY

Example embodiments provide a nonvolatile memory system and a data recovery read (DRR) operation method of the nonvolatile memory system that may reduce read latency during a DRR operation and improve reliability of the DRR operation.

According to an aspect of an example embodiment, a data recover read (DRR) operation method of a nonvolatile memory system includes: performing a first read operation on adjacent memory cells, which are connected to an adjacent wordline adjacent to a target wordline, based on a first specific read level; obtaining a cell count value for the adjacent wordline; determining offset values for a normal read level of target memory cells, which are connected to the target wordline, based on the cell count value for the adjacent wordline; and performing a second read operation on the target memory cells, based on the determined offset values and a result of the first read operation.

The first specific read level may be a normal read level corresponding to a specific program state, among a plurality of program states, of the adjacent memory cells.

The cell count value for the adjacent wordline may include at least one of an ON-cell count value related to a number of turned-on adjacent memory cells, an OFF-cell count value related to a number of turned-off adjacent memory cells, or a difference value between the ON-cell count value and the OFF-cell count value.

The determining the offset values may include: determining the offset values based on the cell count value for the adjacent wordline and a value of additional information, and the additional information may include at least one of a program/erase (P/E) cycle of the target memory cells, temperature of the target memory cells, or a location of the target wordline.

The determining the offset values may include: determining the offset values based on an offset table, the offset table including predetermined offset values in association with the cell count value and the value of the additional information.

The determining the offset values based on the cell count value and the value of the additional information may include determining the offset values based on at least one of an algorithm or an equation, and the at least one of the algorithm or the equation may be derived through machine learning based on training data, the training data including the cell count value, the value of the additional information, and an optimal offset value.

Each of the target memory cells may belong to a single group, among a plurality of groups, based on a program state of an adjacent memory cell sharing a bitline with a corresponding target memory cell, and the determined offset values may correspond to the plurality of groups, respectively.

The plurality of groups may belong to a single DRR group, which is selected based on the cell count value for the adjacent wordline, among a plurality of DRR groups including different numbers of groups.

The plurality of DRR groups may include a first DRR group and a second DRR group, the first DRR group including two groups distinguished with each other with respect to the first specific read level, and the second DRR group including four groups distinguished with one another with respect to three specific read levels, and the three specific read levels may include the first specific read level, a second specific read level lower than the first specific read level, and a third specific read level higher than the first specific read level.

The DRR operation method may further include, based on the second DRR group being selected, performing a third read operation based on the second specific read level on the adjacent memory cells and performing a fourth read operation on the adjacent memory cells based on the third specific read level on the adjacent memory cells.

The performing the second read operation may include: performing a read operation on the target memory cells based on each of the determined offset values; and combining results of read operations performed based on the each of the determined offset values, based on the result of the first read operation.

The adjacent wordline may be a wordline programmed in a sequence next to the target wordline during a program operation, among wordlines adjacent to the target wordline.

The DRR operation method may be performed based on an uncorrectable error correction code (UECC) being generated in a read operation performed on the target memory cells based on the normal read level.

According to an aspect of an example embodiment, a nonvolatile memory system includes: a nonvolatile memory device including target memory cells, connected to a target wordline, and adjacent memory cells connected to an adjacent wordline adjacent to the target wordline; and a controller configured to control an operation of the nonvolatile memory device, wherein the nonvolatile memory device is configured to perform a first read operation on the adjacent memory cells based on a specific read level and configured to obtain a cell count value for the adjacent wordline, and wherein the controller is configured to determine offset values for calibrating a normal read level of the target memory cells, based on the cell count value for the adjacent wordline, and configured to control the nonvolatile memory device to perform a second read operation on the target memory cells based on the determined offset values and a result of the first read operation.

The specific read level may be a normal read level corresponding to a specific program state, among a plurality of program states of the adjacent memory cells, and the cell count value for the adjacent wordline may include at least one of an ON-cell count value related to a number of turned-on adjacent memory cells, an OFF-cell count value related to a number of turned-off adjacent memory cells, or a difference value between the ON-cell count value and the OFF-cell count value.

The controller may be further configured to determine the offset values based on the cell count value for the adjacent wordline and a value of additional information, and the additional information may include at least one of a program/erase (P/E) cycle of the target memory cells, temperature of the target memory cells, or a location of the target wordline.

The controller may be further configured to determine the offset values based on an offset table, the offset table including predetermined offset values in association with the cell count value and the value of the additional information.

The controller may be further configured to determine the offset values based on at least one of an algorithm or an equation, and the at least one of the algorithm or the equation may be derived through machine learning based on training data, the training data including the cell count value, the value of the additional information, and an optimal offset value.

Each of the target memory cells may belong to a single group, among a plurality of groups, based on a program state of an adjacent memory cell sharing a bitline with a corresponding target memory cell, and the determined offset values may correspond to the plurality of groups, respectively.

According to an aspect of an example embodiment, a nonvolatile memory device includes: a memory cell array including target memory cells, connected to a target wordline, and adjacent memory cells connected to an adjacent wordline adjacent to the target wordline; and a control logic configured to perform a first read operation based on a specific read level and configured to obtain a cell count value for the adjacent wordline, wherein the control logic performs a second read operation on the target memory cells, based on offset values for calibrating a normal read level of target memory cells and a result of the first read operation, and wherein the offset values are determined based on the cell count value for the adjacent wordline.

BRIEF DESCRIPTION OF DRAWINGS

The above and other aspects, features, and advantages of example embodiments will be more clearly understood from the following detailed description, taken in conjunction with the accompanying drawings.

FIG. 7A is a diagram illustrating an example of an offset table including predetermined offset values depending on cell count values.

FIG. 7B is a diagram illustrating an example of an offset table including predetermined offset values depending on cell count values.

FIG. 7C is a diagram illustrating an example of an offset table including predetermined offset values depending on cell count values and values of additional information.

FIG. 10 is a flowchart illustrating a data recover read (DRR) operation method of a nonvolatile memory system according to an example embodiment.

FIG. 11 is a flowchart illustrating a method of operating a nonvolatile memory system according to an example embodiment.

FIG. 15B is a diagram illustrating a DRR operation of a nonvolatile memory system according to an example embodiment.

DETAILED DESCRIPTION

Hereinafter, example embodiments will be described with reference to the accompanying drawings.

The expression "a first," "a second," "the first," or "the second" used in various embodiments of the present disclosure modifies various components regardless of the order or the importance but does not limit the corresponding components.

Figure 1:
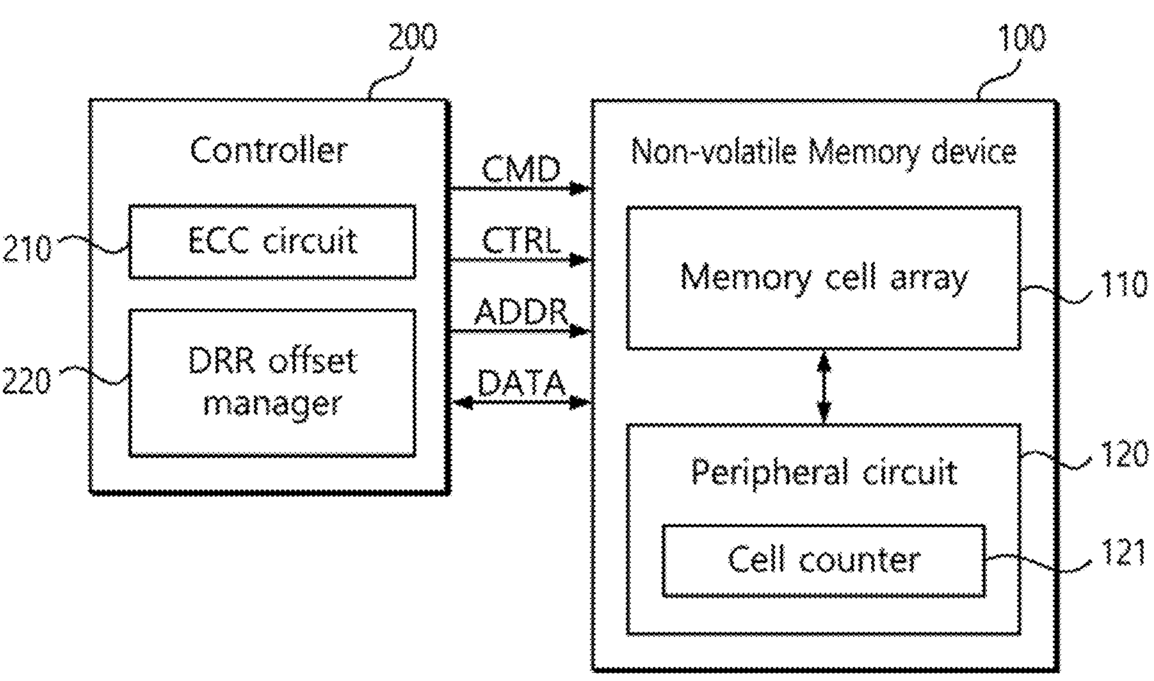
FIG. 1 is a block diagram of a nonvolatile memory system according to an example embodiment.

FIG. 1 is a block diagram of a nonvolatile memory system 1000 according to an example embodiment. Referring to FIG. 1, the nonvolatile memory system 1000 may include a nonvolatile memory device 100 and a controller 200. The nonvolatile memory system 1000 may be implemented as a single storage device, but example embodiments are not limited thereto.

The nonvolatile memory device 100 may include a memory cell array 110 and a peripheral circuit 120. The memory cell array 110 may include memory cells, which are respectively connected to a plurality of bitlines and a plurality of wordlines. In this case, the memory cells may be implemented in various nonvolatile memory devices such as, for example but not limited to, a NAND flash memory, a NOR flash memory, a phase change RAM (PRAM), a resistive RAM (ReRAM), a magnetic RAM (MRAM), or a ferroelectric RAM (FRAM). According to an example embodiment, similarly to a vertical NAND flash memory VNAND, the memory cells may be implemented in a three-dimensional array structure, but example embodiments are not limited thereto.

The peripheral circuit 120 may include various analog circuits or digital circuits required to store data in or read data from the memory cell array 110. The peripheral circuit 120 may store data in the memory cell array 110 or read data stored in the memory cell array 110 and provide the read data to the controller 200, based on a command CMD, an address ADDR, and a control signal CTRL received from the controller 200. The controller 200 may include, for example, a central processing unit or a microprocessor. The controller 200 may control the nonvolatile memory device 100 by executing, for example, software (or a program) and may perform various data processing and/or operations.

For example, according to an example embodiment, the peripheral circuit 120 may perform a data recover read (DRR) operation based on a DRR command received from the controller 200. The DRR operation, as a type of defense code, may refer to a read operation to compensate for a read level in consideration of a distribution change occurring due to interference between wordlines during a program operation.

For example, when a DRR command for a target wordline is received from the controller 200, the peripheral circuit 120 may perform a first read operation on an adjacent wordline adjacent to the target wordline before performing a read operation on the target wordline. The first read operation may be performed based on a first specific read level. The first specific read level may be a normal read level corresponding to a specific program state, among a plurality of program states of adjacent memory cells connected to the adjacent wordline. Therefore, according to the first read operation, the adjacent memory cells may be divided into an ON-cell group, in which the adjacent memory cell is turned on based on the first specific read level, and an OFF-cell group, in which the adjacent memory cell is turned off based on the first specific read level.

In addition, the peripheral circuit 120 may obtain a cell count value for the adjacent wordline adjacent to the target wordline. The cell count value may include at least one of an ON-cell count value related to a number of adjacent memory cells that are connected to the adjacent wordline and turned on based on the first specific read level, an OFF-cell count value related to a number of adjacent memory cells that are connected to the adjacent wordline and turned off based on the first specific read level, and a difference value between the ON-cell count value and the OFF-cell count value.

To this end, the peripheral circuit 120 may include a cell counter 121. The cell counter 121 may count the number of turned-on memory cells and/or the number of turned-off memory cells, with respect to a predetermined read level. Alternatively, the cell counter 121 may count the number of turned-on memory cells and/or the number of turned-off memory cells included within a predetermined read level range. Alternatively, the cell counter 121 may calculate a difference between the number of turned-on memory cells and the number of turned-off memory cells.

For example, the peripheral circuit 120 may obtain a cell count value for an adjacent wordline with respect to a first specific read level. In this case, the cell counter 121 may obtain a cell count value based on a result of the first read operation.

Alternatively, the peripheral circuit 120 may obtain a cell count value for an adjacent wordline corresponding to a predetermined read level range. In this case, the cell counter 121 may obtain the cell count value for the adjacent wordline based on an operation separate from the first read operation. The separate operation may be an ON-chip valley search (OVS) operation or a high-speed read retry (HRR) operation for an adjacent wordline, but example embodiments are not limited thereto. The predetermined read level range may be a predetermined range of read levels including the first specific read level, but example embodiments are not limited thereto. For example, the cell counter 121 may obtain a cell count value including at least one of an ON-cell count value related to a number of adjacent memory cells connected to the adjacent wordline that are turned on based on read levels in the predetermined read level range, an OFF-cell count value related to a number of adjacent memory cells connected to the adjacent wordline that are turned off based on read levels in the predetermined read level range, and a difference value between the ON-cell count value and the OFF-cell count value.

The obtained cell count value for the adjacent wordline may be provided to the controller 200, and may be used to determine offset values for correcting a normal read level corresponding to target memory cells connected to the target wordline.

When information on the determined offset values is received from the controller 200, the peripheral circuit 120 may perform a second read operation on the target wordline based on offset values corresponding to the received information and the result of the first read operation. For example, the peripheral circuit 120 may correct the normal read level for the target memory cells connected to the target wordline based on each of the offset values, and may perform a read operation on the target wordline based on each of the corrected normal read levels. In addition, the peripheral circuit 120 may combine results of read operations on the target wordline performed based on the each of the corrected normal read levels, based on the result of the first read operation. Accordingly, a second read operation may be performed on the target wordline. Herein, the term "second read operation" on the target wordline may comprise a read operation on the target wordline based on each of the corrected normal read levels and an operation of combining the results of the read operations on the target wordline based on the result of the first read operation. This will be described in more detail later.

A series of operations of the peripheral circuit 120 from the above-described first read operation to the above-described second read operation may correspond to the DRR operation according to an example embodiment.

The controller 200 may control the operation of the nonvolatile memory device 100. For example, the controller 200 may provide the address ADDR, the command CMD, and the control signal CTRL to the nonvolatile memory device 100 in response to a request from an external host device to control program, read, and/or erase operation of the nonvolatile memory device 100.

Referring to FIG. 1, the controller 200 may include an error correction code (ECC) circuit 210 and a DRR offset manager 220.

The ECC circuit 210 may detect and correct errors in data DATA read from the nonvolatile memory device 100. For example, the ECC circuit 210 may generate an error correction code for data DATA to be stored in the nonvolatile memory device 100. The generated error correction code may be stored in the nonvolatile memory device 100 together with the data DATA. Then, the ECC circuit 210 may detect and correct errors in the data DATA read from the nonvolatile memory device 100 based on the stored error correction code.

When an error is uncorrectable by the ECC circuit 210, an uncorrectable error correction code (UECC) may be generated. In this case, the controller 200 may execute various defense codes.

According to an example embodiment, when a UECC is generated as a result of a normal read operation on a target wordline, the controller 200 may control the nonvolatile memory device 100 to perform a DRR operation on the target wordline. The normal read operation may refer to a read operation performed based on a normal read level (or a default read level). The normal read level may be a predetermined read voltage based on an initial distribution of threshold voltages of memory cells, but example embodiments are not limited thereto.

The DRR offset manager 220 may determine offset values for correcting the normal read level based on the cell count value. For example, when the DRR offset manager 220 receives a cell count value for an adjacent wordline from the nonvolatile memory device 100, the DRR offset manager 220 may determine offset values based on the received cell count value and provide information on the determined offset values to the nonvolatile memory device 100.

According to an example embodiment, the DRR offset manager 220 may include an offset table. The offset table may include predetermined optimal offset values in association with the cell count value. Accordingly, the DRR offset manager 220 may select, from the offset table, offset values corresponding to the cell count value, received from the nonvolatile memory device 100 and provide information on the selected offset values to the nonvolatile memory device 100.

According to an example embodiment, the DRR offset manager 220 may include an algorithm and/or an equation by which an offset value is determined based on a cell count value. Accordingly, the DRR offset manager 220 may input the cell count value, received from the nonvolatile memory device 100, to the algorithm and/or the equation to obtain offset values, and may provide information on the obtained offset values to the nonvolatile memory device 100.

The nonvolatile memory device 100 may perform the above-described second read operation based on offset values corresponding to the information on the offset values received from the controller 200.

In a related art nonvolatile memory system, a DRR operation is performed by applying DRR offset sets (each including different offset values), respectively corresponding to fixed degradation conditions, in a fixed order. However, such a DRR operation method causes read latency and is limited in securing reliability.

In contrast, the nonvolatile memory system 1000 according to an example embodiment may perform a DRR operation by determining optimal offset values considering distributed degradation conditions at the time of DRR operation through a cell count value and applying the determined offset values. Accordingly, read latency may be reduced, and reliability of DRR operation may be improved. For example, in example embodiments, the DRR operation may be performed by determining optimal offset values through the cell count value and applying the determined offset values, so that read time does not increase even when DRR offset sets (each including different offset values) are further added or subdivided. Accordingly, the optimal offset values may be determined without an increase in read time, compared with related art techniques. As a result, latency may be reduced and reliability of the DRR read operation may be improved.

Figure 2:
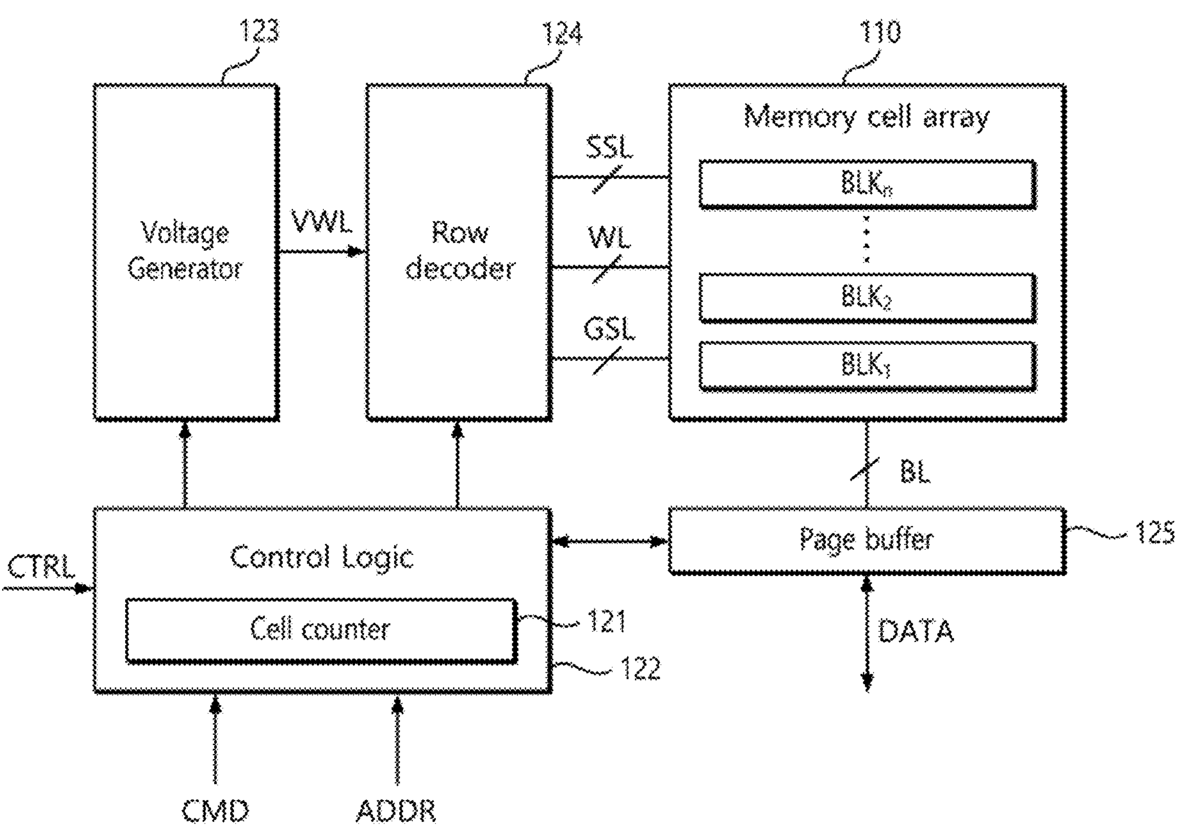
FIG. 2 is a block diagram illustrating an example configuration of the nonvolatile memory device illustrated in FIG. 1.

FIG. 2 is a block diagram illustrating an example of a configuration of the nonvolatile memory device 100 illustrated in FIG. 1. Referring to FIG. 2, the nonvolatile memory device 100 may include a memory cell array 110, a control logic 122, a voltage generator 123, a row decoder 124, and a page buffer 125.

The memory cell array 110 may include a plurality of memory blocks BLK1 to BLKn. Each of the plurality of memory blocks BLK1 to BLKn may include a plurality of pages, and each of the plurality of pages may include a plurality of memory cells. The plurality of memory cells may be connected to wordlines WL and bitlines BL.

The memory cell array 110 may be connected to the row decoder 124 through the wordlines WL, string select lines SSL, and ground select lines GSL, and may be connected to the page buffer 125 through the bitlines BL. Each memory cell may store one or more bits. For example, each memory cell may be used as a single-level cell (SLC), a multilevel cell (MLC), a triple-level cell (TLC), a quad-level cell (QLC), or the like.

The control logic 122 may output various control signals for programming data in the memory cell array 110, reading data from the memory cell array 110, and/or erasing data stored in the memory cell array 110, based on the command CMD, the address ADDR, and the control signal CTRL received from the controller 200. Accordingly, the control logic 122 may control the overall operation of the nonvolatile memory device 100.

Various control signals output from the control logic 122 may be provided to the voltage generator 123, the row decoder 124, and the page buffer 125. For example, the control logic 122 may provide a voltage control signal to the voltage generator 123, a row address to the row decoder 140, and a column address to the page buffer 150, but example embodiments are not limited thereto.

The control logic 122 may control the voltage generator 123 and the row decoder 124 to apply a read voltage corresponding to a first specific read level to an adjacent wordline, adjacent to a target wordline, during a DRR operation on the target wordline. As a result, a first read operation may be performed. A result of the first read operation may include data indicating whether each of the adjacent memory cells connected to adjacent wordlines belongs to an ON-cell group or an OFF-cell group (that is, whether being turned on or turned off), with respect to the first specific read level, and may be stored in the page buffer 125.

The adjacent wordline may be a wordline programmed in a sequence next to the target wordline during a programming operation. For example, when the target wordline is WL(n) and a program operation is performed in the order WL(n+1), WL(n), and WL(n−1), the adjacent wordline may be WL(n−1). However, example embodiments are not limited thereto.

The first specific level may be a normal read level corresponding to a specific program state, among a plurality of program states of adjacent memory cells connected to the adjacent wordline. For example, when adjacent memory cells connected to the adjacent wordline WL(n−1) are used as TLCs, a normal read level corresponding to a program state, among eight program states, an erase state E and program states P1 to P7, of the adjacent memory cells, may be a first specific level.

The control logic 122 may obtain a cell count value for an adjacent wordline during a DRR operation on the target wordline. To this end, the control logic 122 may include the cell counter 121. For example, the cell counter 121 may obtain a cell count value with respect to the first specific read level based on the result of the first read operation stored in the page buffer 125. Alternatively, the cell counter 121 may obtain a cell count value corresponding to a predetermined read level range based on a result of an additional operation stored in the page buffer 125.

The obtained cell count value may be provided to the controller 200 and used to determine offset values for correcting the normal read level for the target wordline (that is, the normal read level for a read operation of target memory cells connected to the target wordline).

FIG. 2 illustrates an example in which the cell counter 121 is included in the control logic 122, but example embodiments are not limited thereto. For example, the cell counter 121 may be implemented as a component, separate from the control logic 122, within the nonvolatile memory device 100. In some embodiments, the result of the first read operation may be provided to the controller 200 and the controller 200 may obtain a cell count value or a difference value between the ON-cell count value and the OFF-cell count value based on the result of the first read operation.

The control logic 122 may control the voltage generator 123 and the row decoder 124 to correct the normal read level for the target wordline based on the offset values during the DRR operation for the target wordline and to apply a read voltage corresponding to corrected normal read level to the target wordline.

The offset values may correspond to information on offset values received from the controller 200. In an example embodiment, the controller 200 may determine offset values for correcting the normal read level based on the above-described cell count value, and may provide the determined offset values to the nonvolatile memory device 100. In this case, the control logic 122 may correct the normal read level based on the offset values provided from the controller 200.

In an example embodiment, the nonvolatile memory device 100 may store an offset table including predetermined offset values. In this case, the controller 200 may determine offset values for correcting the normal read level for the target wordline based on the cell count value (e.g., using the offset table, an algorithm and/or an equation included in the DRR offset manager 220), and may provide only index information corresponding to the determined offset values to the nonvolatile memory device 100. The control logic 122 may select offset values corresponding to the index information, provided from the controller 200, from the offset table stored in the nonvolatile memory device 100, and may correct the normal read level based on the selected offset values. In an example embodiment, the offset table included in the nonvolatile memory device 100 may be the same as the offset table included in the DRR offset manager 220, but the example embodiments are not limited thereto.

The control logic 122 may perform a read operation on the target wordline for each offset value during a DRR operation on the target wordline. For example, when the offset values determined by the controller 200 include a first offset value and a second offset value, the control logic 122 may correct the normal read level based on the first offset value and may control the voltage generator 123 and the row decoder 124 to apply a read voltage corresponding to the corrected read level to the target wordline. Accordingly, a read operation may be performed on the target wordline based on the first offset value. In addition, the control logic 122 may correct the normal read voltage based on the second offset value, and may control the voltage generator 123 and the row decoder 124 to apply a read voltage corresponding to the corrected normal read level to the target wordline. Accordingly, a read operation may be performed on the target wordline based on the second offset value.

In this case, the results of the read operations based on the first and the second offset values each include read data on all target memory cells connected to the target wordline. Therefore, the correct data may be selected from each of the results of the read operations.

In this regard, target memory cells connected to the target wordline may be divided into a plurality of groups based on a program state of adjacent memory cells, and the first and the second offset values may correspond to each of the plurality of groups. For example, among the target memory cells, a target memory cell sharing a bitline with an adjacent memory cell belonging to an ON-cell group with respect to a first specific read level may belong to a first group. Among the target memory cells, a target memory cell sharing a bitline with an adjacent memory cell belonging to an OFF-cell group with respect to the first specific read level may belong to a second group. The first offset value may be an offset value corresponding to the first group (that is, the normal read level for the target memory cell of the first group may be corrected based on the first offset value), and the second offset value may be an offset value corresponding to the second group (that is, the normal read level for the target memory cell of the second group may be corrected based on the second offset value).

Therefore, for target memory cells belonging to the first group, a result of a read operation based on the first offset value (that is, a result of a read operation performed with respect to a normal read level corrected based on the first offset value) may be a correct read result, and for target memory cells belonging to the second group, a result of a read operation based on the second offset value (that is, a result of a read operation performed with respect to a normal read level corrected based on the second offset value) may be a correct read result.

As described above, the result of the first read operation may include data indicating which group each of the adjacent memory cells belong to, either the ON-cell group or the OFF-cell group. Since indicating which group each of the adjacent memory cells belong to indicates which group each of the target memory cells belong to, the control logic 122 may identify which group each of the target memory cells belongs to, either the first group or the second group, based on the result of the first read operation.

Accordingly, the control logic 122 may perform a second read operation on the target wordline by selecting, based on the result of the first read operation, correct data from the read result performed based on each offset value and combining the selected data.

While the example in which two offset values are determined by the controller 200 has been described, but example embodiments are not limited thereto. For example, even when three or more offset values are determined by the controller 200, the control logic 122 may perform a read operation on the target wordline for each of the offset values (that is, by correcting the normal read level by using each of the offset values). However, even in this case, a read operation based on an additional specific read level, different from the first specific read level, may be additionally required to further group the target memory cells. This will be described in detail later.

The voltage generator 123 may generate various types of voltages to perform program, read, and erase operations on the memory cell array 110 based on the voltage control signal provided from the control logic 122. For example, the voltage generator 123 may generate a wordline driving voltage VWL (for example, a program voltage, a program pass voltage, a read voltage, a read pass voltage, an erase verify voltage, a program verify voltage, or the like) for driving a wordlines WL. In this case, the read voltage may include read voltages corresponding to a specific read level for performing a first read operation on adjacent memory cells, a normal read level corresponding to a target wordline, or a corrected normal read level for performing a second read operation for target memory cells connected to the target wordline.

In addition, the voltage generator 123 may generate a string select line driving voltage for driving the string select lines SSL and a ground select line driving voltage for driving the ground select lines GSL. In addition, the voltage generator 123 may generate an erase voltage to be provided to the memory cell array 110.

The row decoder 124 may select a portion of the wordlines WL in response to a row address received from the control logic 122. The row decoder 124 may transfer the wordline driving voltage VWL, corresponding to an operation mode, to the selected wordline. For example, the row decoder 124 may apply a read voltage to a selected wordline and a read pass voltage to an unselected wordline, during a read operation. In addition, the row decoder 124 may apply a program voltage to a selected wordline and a program pass voltage to an unselected wordline, during a program operation.

In addition, the row decoder 124 may select a portion of the string select lines SSL or a portion of the ground select lines GSL in response to the row address received from the control logic 122.

The page buffer 125 may be connected to the memory cell array 110 through the bitlines BL. The page buffer 125 may temporarily store data to be stored in the memory cell array 110 or data read from the memory cell array 110. For example, the page buffer 125 may store the result of the first read operation. In addition, the page buffer 125 may store the results of a separate operation such as HRR or OVS, according to an example embodiment.

Figure 3:
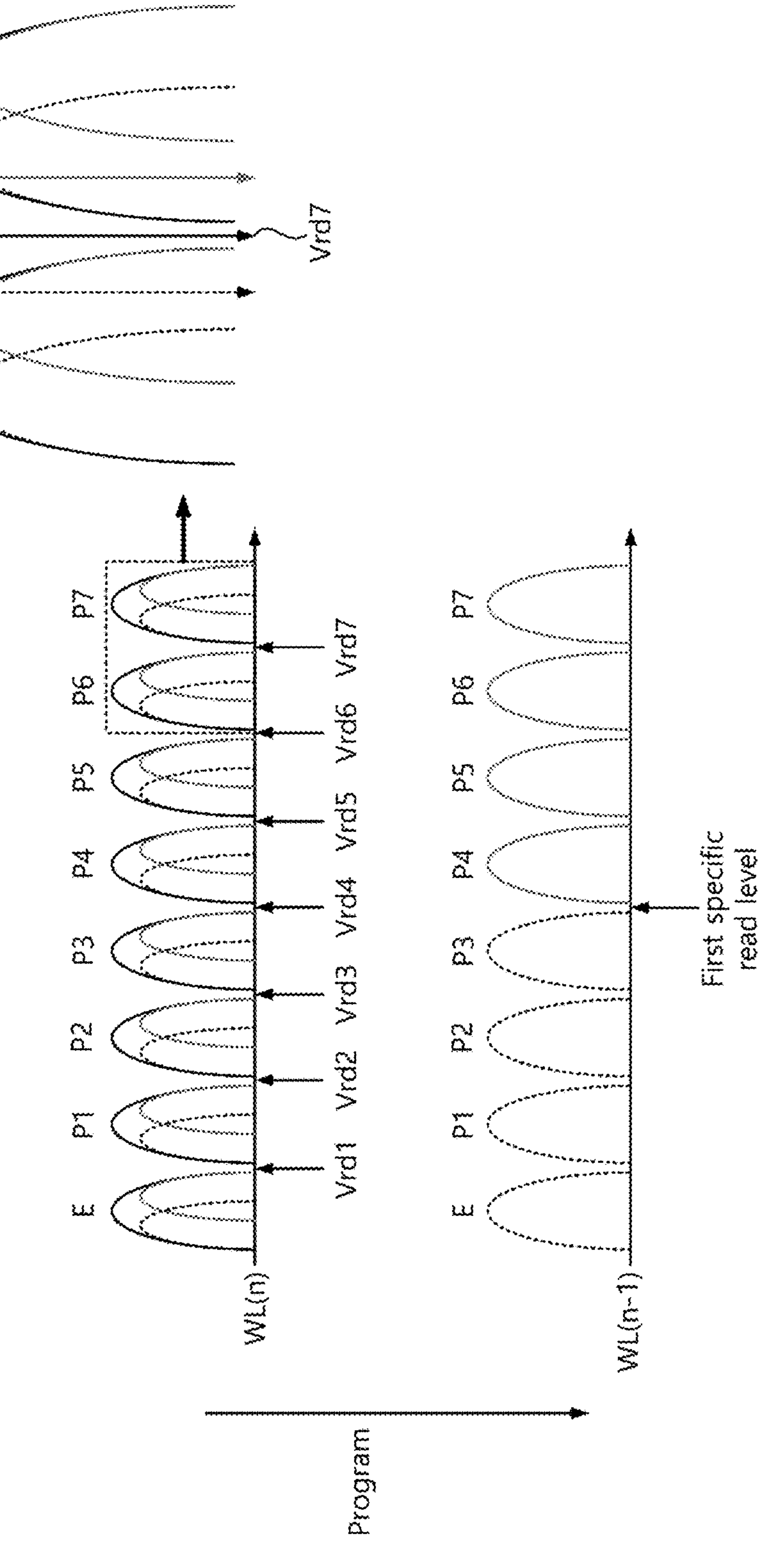
FIG. 3 is a diagram illustrating a distribution change, occurring due to interference between wordlines during a program operation, according to an example embodiment.

FIG. 3 is a diagram illustrating a distribution change, occurring due to interference between wordlines during a program operation, according to an example embodiment. In FIG. 3, WL(n) and WL(n−1) represent two adjacent wordlines. FIG. 3 illustrates an example in which memory cells connected to WL(n) and WL(n−1) are used as a TLC. For example, memory cells connected to WL(n) and WL(n−1) may have a single state, among eight program states such as an erase state E and first to seventh states P1 to P7. In FIG. 3, Vrd1 to Vrd7 represent normal read levels (or default read levels) corresponding to the eight program states, E and P1 to P7.

When data is programmed in WL(n−1) after a program operation on WL(n) is completed, a threshold voltage distribution of memory cells connected to WL(n) may be affected differently depending on a pattern of data programmed in memory cells connected to WL(n−1).

For example, referring to FIG. 3, when data of a pattern such as E, P1, P2, or P3 is programmed in the memory cells of WL(n−1), a threshold voltage distribution of the memory cells of WL(n) sharing a bitline with the corresponding memory cells of WL(n−1) may be shifted in a negative (−) direction. In addition, when data of a pattern such as P4, P5, P6 or P7 is programmed in the memory cells of WL(n−1), a threshold voltage distribution of the memory cells of WL(n) sharing a bitline with the corresponding memory cells of WL(n−1) may be shifted in a positive (+) direction.

Such a change (or deterioration) in the threshold voltage distribution causes a need for correction of a normal read voltage. For example, referring to the enlarged drawing of P6 and P7 of WL(n), a normal read level Vrd7 may be valid as a read level in an initial distribution state. However, when the distribution of WL(n) is shifted in the negative (−) or positive (+) direction depending on the pattern of data programmed in WL(n−1), the normal read level Vrd7 needs to be corrected by a negative (−) offset value a or a positive (+) offset value B. This may be equally applied to the remaining normal read levels Vrd1 to Vrd6.

As described above, according to example embodiments, the offset values a and B may be determined based on a cell count value of the adjacent wordline WL(n−1), and a normal read level may be corrected based on the determined offset values a and B.

For example, the nonvolatile memory device 100 may perform a first read operation on the adjacent wordline WL(n−1) based on a first specific read level. In this case, the first specific read level may be a normal read level Vrd4 corresponding to the program state P4 among the seven program states P1 to P7 of WL(n−1), but example embodiments are not limited thereto. According to an example embodiment, a normal read level Vrd1, Vrd2, Vrd3, Vrd5, Vrd6, or Vrd7 corresponding to another program state may also be the first specific read level. In the example of FIG. 3, the memory cells of WL(n−1) may be divided into an ON-cell group turned on based on the first specific read level Vrd4 and an OFF-cell group turned off based on the first specific read level Vrd4, as a result of the first read operation.

In addition, the nonvolatile memory device 100 may obtain a cell count value for the adjacent wordline WL(n−1). For example, the nonvolatile memory device 100 may obtain a cell count value based on the result of the first read operation, but example embodiments are not limited thereto.

The obtained cell count value may be provided to the controller 200, and the controller 200 may determine offset values based on the cell count value. For example, the controller 200 may determine offset values using an offset table including offset values based on cell count values, or an algorithm and/or equation by which offset values are determined based on cell count values.

The determined offset values may be provided to the nonvolatile memory device 100. The nonvolatile memory device 100 may correct the normal read level corresponding to the target wordline by reflecting the offset values and perform a read operation on the target wordline based on the corrected normal read level. In addition, the nonvolatile memory device 100 may combine the results of read operations, respectively performed based on the offset values, based on the result of the first read operation. Accordingly, a second read operation may be performed on the target wordline.

Figure 4:
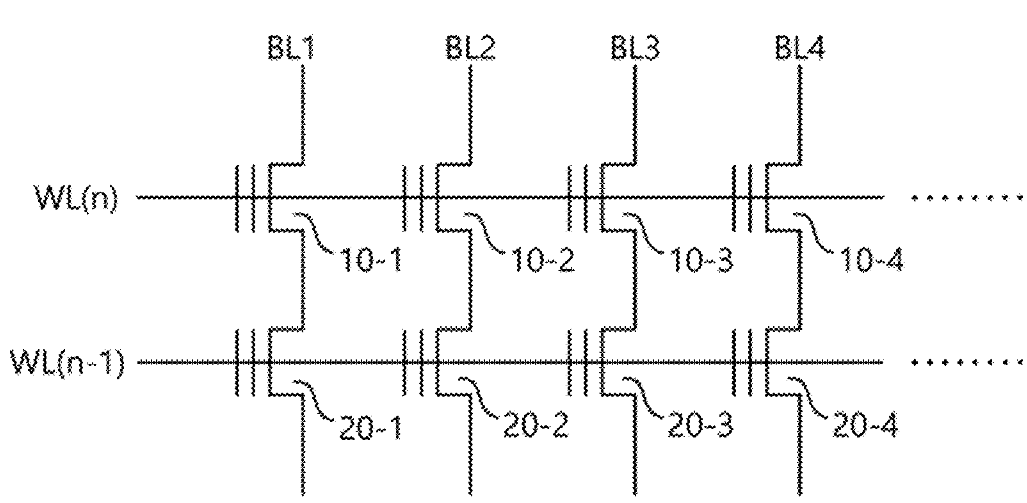
FIG. 4 is a diagram illustrating a group of target memory cells according to an example embodiment.

FIG. 4 is a diagram illustrating a group of target memory cells according to an example embodiment. In FIG. 4, WL(n) represents a target wordline and WL(n−1) represents an adjacent wordline.

For example, when a first read operation is performed on WL(n−1) using the first specific read level Vrd4 illustrated in FIG. 3, adjacent memory cells connected to WL(n−1) may be divided into an ON-cell group and an OFF-cell group with respect to the first specific read level Vrd4. Referring to FIG. 4, when the ON-cell group is represented “0” and the OFF-cell group is represented as “1,” the adjacent memory cells 20-1, 20-4, . . . may belong to the OFF-cell group, and the adjacent memory cells 20-2, 20-3 . . . may belong to the ON-cell group.

In this case, referring to FIG. 3, adjacent memory cells 20-2, 20-3, . . . belonging to the ON-cell group may be in a state in which data of a pattern such as E, P1, P2, or P3 is programmed. Accordingly, a threshold voltage distribution of the target memory cells 10-2, 10-3, . . . sharing a bitline with the adjacent memory cells 20-2, 20-3, . . . may be shifted in a negative (−) direction. In addition, adjacent memory cells 20-1, 20-4, . . . belonging to the OFF-cell group may be in a state in which data of a pattern such as P4, P5, P6, or P7 is programmed. Accordingly, a threshold voltage distribution of the target memory cells 10-1, 10-4, . . . sharing a bitline with the adjacent memory cells 20-1, 20-4 . . . may be shifted in a positive (+) direction.

As described above, the threshold voltage distribution of target memory cells may vary depending on program states of adjacent memory cells. Therefore, according to an example embodiment, target memory cells may be divided into a plurality of groups depending on the program states of adjacent memory cells. In addition, an offset value for correcting a normal read level corresponding to the target wordline may also be set to be different for each group to which the target memory cell belongs.

For example, referring to FIG. 4, the target memory cells 10-2, 10-3, . . . sharing a bitline with adjacent memory cells 20-2, 20-3, . . . belonging to the ON-cell group may be categorized as a first group GR1, and target memory cells 10-1, 10-4, . . . sharing a bitline with adjacent memory cells 20-1, 20-4, . . . belonging to the OFF-cell group may be categorized as a second group GR2.

According to an example embodiment, the nonvolatile memory device 100 may receive information on a first offset value corresponding to the first group GR1 and a second offset value corresponding to the second group GR2 from the controller 200. In this case, the nonvolatile memory device 100 may perform a second read operation based on the first offset value and the second offset value.

According to an example embodiment, the nonvolatile memory device 100 may receive information on four offset values, respectively corresponding to four groups, from the controller 200. In this case, the nonvolatile memory device 100 may divide target memory cells into four groups through an additional read operation on an adjacent wordline. Accordingly, the nonvolatile memory device 100 may perform a second read operation based on the four offset values.

According to an example embodiment, the cell counter 121 may obtain a cell count value based on a result of the first read operation on the adjacent wordline. For example, referring to FIG. 4, the result of the first read operation for WL(n−1) may include data, such as 1, 0, 0, 1, . . . , indicating which group adjacent memory cells belong to, either the ON-cell group or the OFF-cell group. Accordingly, the cell counter 121 may obtain an ON-cell count value based on the first specific read voltage by summing the number of Os from the result of the first read operation. In addition, the cell counter 121 may obtain an OFF-cell count value based on the first specific read voltage by summing the number of 1*s* from the result of the first read operation. According to an example embodiment, the cell counter 121 may calculate a difference between the ON-cell count value and the OFF-cell count value (that is, a difference between the number of Os and the number of Is in the result of the first read operation).

An example, in which the cell counter 121 obtains the cell count value, is not limited to the above-described example. According to an example embodiment, the cell count value for an adjacent wordline may be obtained through an operation, separate from the first read operation, such as an OVS operation or an HRR operation on the adjacent wordline.

Figure 5A:
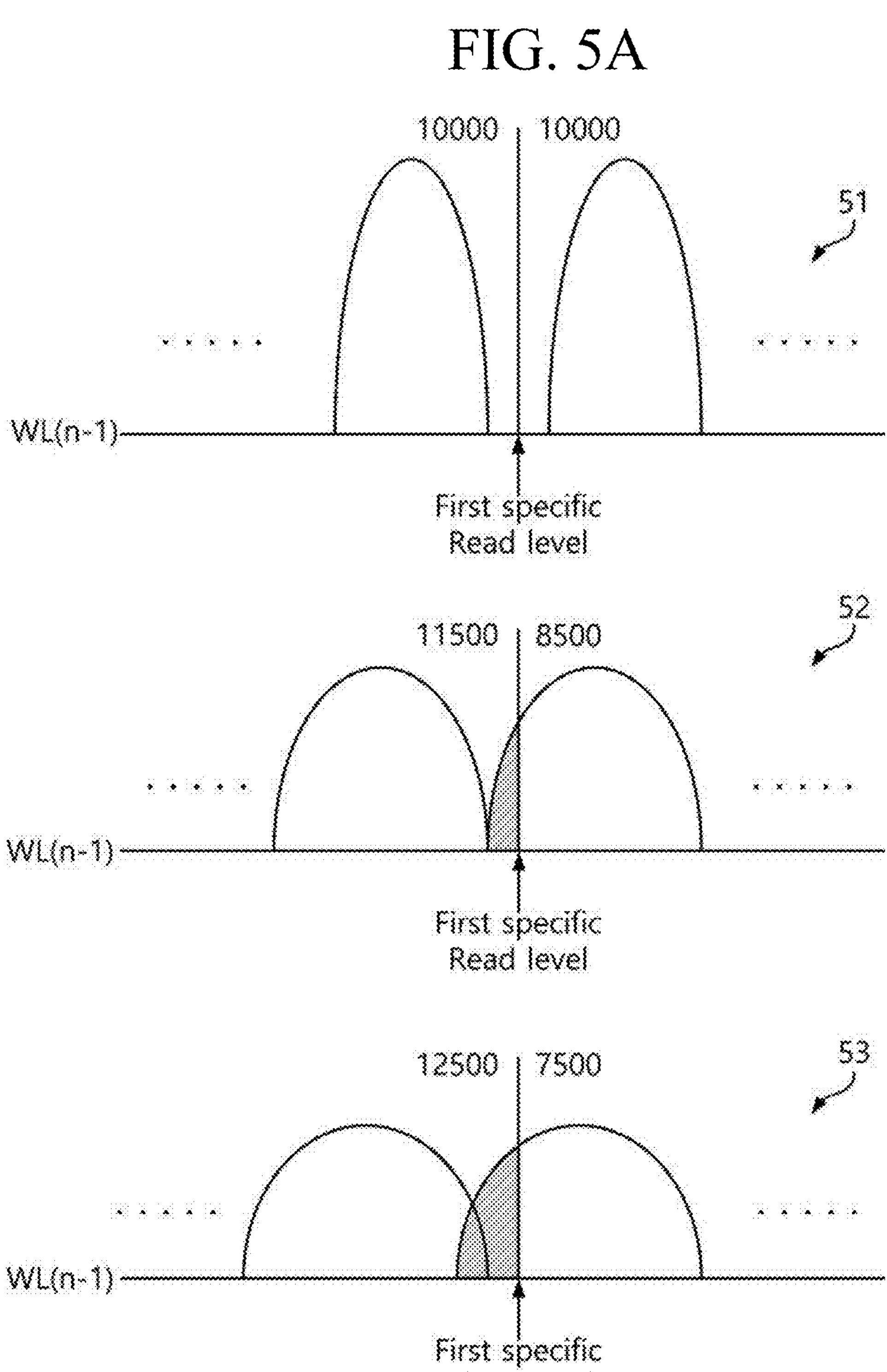
FIG. 5A is a diagram illustrating cell count values according to example embodiments.
Figure 5B:
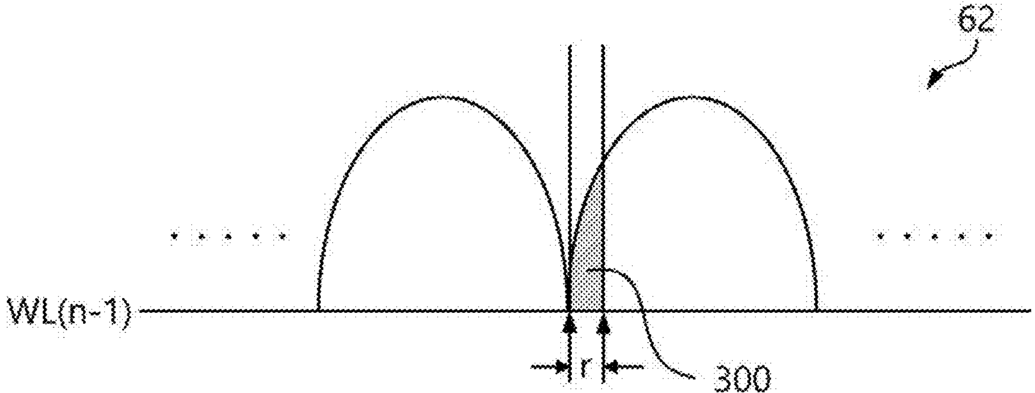
FIG. 5B is a diagram illustrating cell count values according to example embodiments.
Figure 5B:
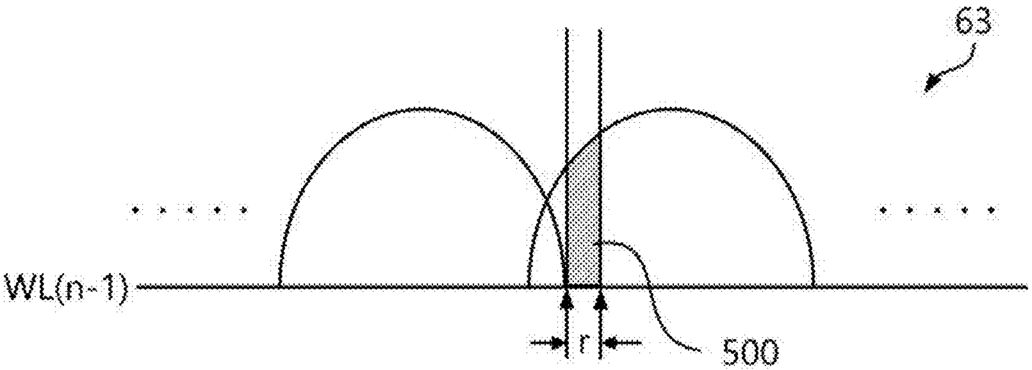

FIGS. 5A and 5B are diagrams illustrating cell count values according to example embodiments. FIGS. 5A and 5B illustrate threshold voltage distributions of adjacent memory cells connected to an adjacent wordline WL(n−1).

In FIG. 5A, reference number 51 indicates an initial distribution, and reference numbers 52 and 53 indicate states in which deterioration of distribution increases according to an order named.

Referring to FIG. 5A, as the degree of degradation of distribution increases, a cell count value (e.g., an ON-cell count value) based on a first specific read level may increase. For example, as indicated by reference numeral 51, the number of ON-cells and the number of OFF-cells based on the first specific read level in the initial distribution may each be 10,000. In this case, when the distribution deteriorates, for example, an ON-cell count value may increase. For example, as indicated by reference numerals 52 and 53, the ON-cell count value may gradually increase to 11,500 and 12,500 as the deterioration of the distribution increases. This may also be equally applied to a difference between the ON-cell count value and the OFF-cell count value. For example, in an initial distribution state, a difference value is 0 but as indicated by the reference numbers 52 and 53, the difference value may gradually increase to 3000 or 5000 as the deterioration of the distribution increases.

FIG. 5B illustrates an example of cell count values corresponding to a predetermined read level range. In FIG. 5B, reference number 61 indicates an initial distribution, and reference numbers 62 and 63 indicate states in which the deterioration of distribution increases according to an order named.

Referring to FIG. 5B, as the degree of deterioration of distribution increases, a cell count value corresponding to a predetermined read level range "r" may increase. For example, as indicated by reference numeral 61, the number of ON-cells corresponding to the predetermined read level range "r" may be 0 in an initial distribution. In this case, when the distribution deteriorates, an ON-cell count value corresponding to the predetermined read level range "r" may increase. For example, as indicated by reference numerals 62 and 63, the ON-cell count value corresponding to the predetermined read level range "r" may gradually increase to 300 and to 500 as the deterioration of the distribution increases.

As described above in FIGS. 5A and 5B, the cell count value may vary depending on the degree of deterioration of the distribution. Accordingly, the degree of degradation of distribution for adjacent wordlines may be determined based on a cell count value for an adjacent wordline. The adjacent wordline and a target wordline are adjacent to each other, so that the degree of deterioration of distribution degradation is estimated to be the same or substantially the same. Accordingly, the degree of degradation of distribution for the target wordline may be determined based on a cell count value of the adjacent wordline.

The degree of deterioration of distribution may affect a size of an offset value for correcting a normal read level. For example, the greater the degree of deterioration of distribution is, the larger the offset value may be required to be. Therefore, according to example embodiments, offset values may be determined to vary depending on the cell count value of an adjacent wordline.

Figure 6:
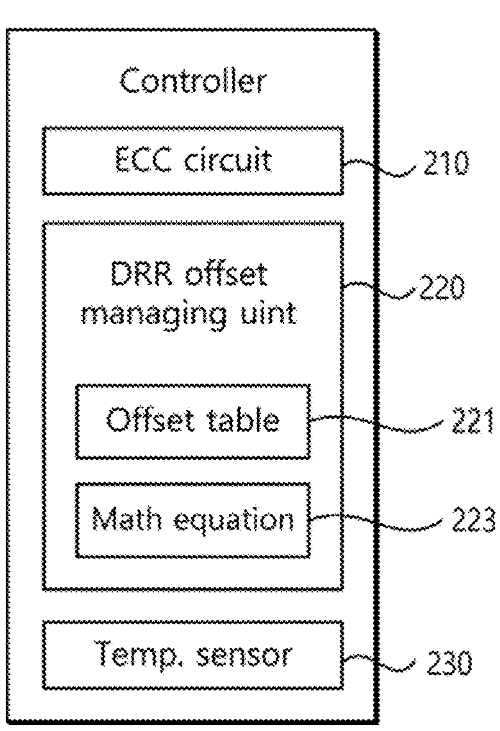
FIG. 6 is a block diagram illustrating an example of a configuration of a controller illustrated in FIG. 1.

FIG. 6 is a block diagram illustrating an example of a configuration of the controller 200 illustrated in FIG. 1. Referring to FIG. 6, the controller 200 may include an ECC circuit 210, a DRR offset manager 220, and a temperature sensor 230.

The ECC circuit 210 has been described in detail in FIG. 1, and redundant description thereof will be omitted.

The DRR offset manager 220 may determine offset values for correcting the normal read level corresponding to a target wordline based on the cell count value of an adjacent wordline. For example, when the DRR offset manager 220 receives a cell count value for an adjacent wordline from the nonvolatile memory device 100, the DRR offset manager 220 may determines offset values based on the received cell count value and may provide information on the determined offset values to the nonvolatile memory device 100.

According to an example embodiment, the DRR offset manager 220 may determine offset values based on the cell count value and a value of additional information. For example, the DRR offset manager 220 may determine offset values based on the cell count value for the adjacent wordline and a value of additional information corresponding to a time point at which a DRR operation is performed. The additional information may include at least one of a program/erase (P/E) cycle of target memory cells, temperature of the target memory cells, and a location of a target wordline. The time point at which the DRR operation is performed may include various time points related to the above-described DRR operation. For example, the time point at which the DRR operation is performed may include a time point at which an uncorrectable error correction code (UECC) is generated as a result of a normal read on a target wordline to generate a DRR command, a time point at which the first read operation is performed in the nonvolatile memory device 100, a time point at which the cell count value for the adjacent wordline is received from the volatile memory device 100, or the like, but example embodiments are not limited thereto.

The P/E cycle may represent the number of program and erase operations that have been performed on a memory cell up to a current time. In general, memory cells that have undergone many program and erase operations are more likely to deteriorate. For example, the degree of deterioration of a threshold voltage distribution of memory cells may vary depending on a value of the P/E cycle of the memory cells. Therefore, according to an example embodiment, the DRR offset manager 220 may determine offset values by additionally using the P/E cycle value of the target memory cells corresponding to the time point at which the DRR operation is performed, as well as a cell count value for an adjacent wordline.

For example, the controller 200 may store and manage P/E cycle information of memory cells included in the memory cell array 110 of the nonvolatile memory device 100. Accordingly, the DRR offset manager 220 may identify the P/E cycle values of the target memory cells corresponding to the time point at which the DRR operation is performed. For example, when receiving a cell count value for an adjacent wordline from the nonvolatile memory device 100, the DRR offset manager 220 may identify a current P/E cycle value of the target memory cells. Accordingly, the DRR offset manager 220 may determine offset values based on the received cell count value and the identified P/E cycle value.

The degree of deterioration of the threshold voltage distribution of memory cells may vary depending on the temperature of the memory cells. For example, the degree of degradation of a threshold voltage distribution may increase as the temperature increases, but example embodiments are not limited thereto. Therefore, according to an example embodiment, the DRR offset manager 220 may determine offset values by additionally using a temperature value of the target memory cells corresponding to the time point at which the DRR operation is performed, as well as a cell count value for an adjacent wordline.

For example, the controller 200 may include a temperature sensor 230. The temperature sensor 230 may detect the surrounding temperature. Accordingly, the DRR offset manager 220 may estimate the temperature of target memory cells corresponding to the time when the DRR operation is performed based on the temperature detected through the temperature sensor 230. For example, when receiving a cell count value for an adjacent wordline from the nonvolatile memory device 100, the DRR offset manager 220 may estimate current temperature of the target memory cells. Accordingly, the DRR offset manager 220 may determine offset values based on the received cell count value and the estimated temperature value of the target memory cells.

As the number of stacked wordlines increases, the degree of deterioration of memory cells may vary depending on locations of the wordlines even under the same conditions. For example, the degree of deterioration of the threshold voltage distribution of memory cells may vary depending on a location of a wordline. Therefore, according to an example embodiment, the DRR offset manager 220 may determine offset values by additionally using a location of a target wordline, as well as a cell count value for an adjacent wordline.

For example, the controller 200 may manage location information of wordlines included in the memory cell array 110 of the nonvolatile memory device 100. Accordingly, the DRR offset manager 220 may identify a location of a target wordline at the time point at which the DRR operation is performed. For example, when receiving a cell count value for an adjacent wordline from the nonvolatile memory device 100, the DRR offset manager 220 may identify the location of the target wordline. Accordingly, the DRR offset manager 220 may determine offset values based on the received cell count value and the identified location value.

The DRR offset manager 220 may include an offset table 221 and/or an equation 223. According to an example embodiment, the DRR offset manager 220 may determine offset values using the offset table 221 and/or the equation 223.

The offset table 221 may include optimal offset values matching cell count values. An optimal offset value corresponding to the cell count value may be determined based on existing experimental data. In this case, the DRR offset manager 220 may select offset values, corresponding to the cell count value received from the nonvolatile memory device 100, from the offset table to determine offset values.

Alternatively, the offset table 221 may include offset values matching a cell count value and a value of additional information. An optimal offset value corresponding to the cell count value and the value of additional information may be determined based on existing experimental data. In this case, the DRR offset manager 220 may select offset values, corresponding to the cell count value and the value of additional information, from the offset table to determine offset values. In this case, the cell count value may be received from the nonvolatile memory device 100, and the value of the additional information may be identified or estimated by the DRR offset manager 220, as described above.

The equation 223 may define an offset value based on the cell count value. The equation 223 may be pre-derived through machine learning based on training data including cell count values and optimal offset values. In this case, the DRR offset manager 220 may input the cell count value, received from the nonvolatile memory device 100, to the equation 223 to determine the offset values. The equation 223 may also be referred to as, for example, an algorithm or a machine learning algorithm. Machine learning algorithm may include, but are not limited to, e.g., supervised learning, unsupervised learning, semi-supervised learning, or reinforcement learning. Such learning may be performed by an electronic device including a nonvolatile memory system according to an example embodiment (e.g., the nonvolatile memory system 1000 in FIG. 1) or via a separate server. According to an embodiment, the nonvolatile memory system may include a hardware structure (e.g., a neural processing unit) specified for processing an artificial intelligence model. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

Alternatively, the equation 223 may define offset values based on the values of cell count values and additional information. The equation 223 may be pre-derived through machine learning based on training data including the cell count values, values of the additional information, and optimal offset values. In this case, the DRR offset manager 220 may input the cell count values and the values of additional information to the equation 223 to determine offset values. In this case, the cell count values may be received from the nonvolatile memory device 100, and the values of the additional information may be identified or estimated by the DRR offset manager 220, as described above.

For ease of description, FIG. 6 illustrates an example in which the DRR offset manager 220 includes both the offset table 221 and the equation 223, but example embodiments are not limited thereto. According to an example embodiment, the DRR offset manager 220 may include either the offset table 221 or the equation 223.

FIGS. 7A to 7C are diagrams illustrating offset tables according to example embodiments. In FIGS. 7A to 7C, a case in which a cell count value x is a difference between an ON-cell count value and an OFF-cell count value is provided as an example, but example embodiments are not limited thereto.

FIG. 7A illustrates an example of an offset table including predetermined offset values based on cell count values. Referring to FIG. 7A, an offset table 221-1 may include offset values matching a cell count value x. For example, when a DRR command for a target wordline is received, the control logic 122 may perform a first read operation on an adjacent wordline based on a first specific read level. In addition, the control logic 122 may obtain a cell count value for an adjacent wordline and provide the obtained cell count value to the controller 200.

The DRR offset manager 220 may select offset values, corresponding to the cell count values for adjacent wordlines received from the nonvolatile memory device 100, from the offset table to determine offset values. For example, when the received cell count value is 1500, the DRR offset manager 220 may determine the offset values to be −10 (for target memory cells belonging to the group GR1, that share a bitline with adjacent memory cells belonging to the ON-cell group) and +10 (for target memory cells belonging to the group GR2, that share a bitline with adjacent memory cells belonging to the OFF-cell group).

When information on the offset values is received from the controller 200, the nonvolatile memory device 100 may perform a second read operation on a target wordline based on offset values corresponding to the received information and a result of the first read operation. For example, the control logic 122 may calibrate a normal read level based on each of the offset values (−10 and +10), and may perform a read operation on the target wordline based on each of the calibrated normal read level. In addition, the control logic 122 may combine the results of the read operations on the target wordline based on the result of the first read operation.

When the cell count value for the adjacent wordline received from the nonvolatile memory device 100 is within a range of 3000 or more to less than 5000, the DRR offset manager 220 may determine the offset values to be −15 (for target memory cells belonging to the group GR1) and +15 (for target memory cells belonging to the group GR2). In this case, only a difference from the offset values of −10 and +10 may be the size of the offset values, and the rest of the DRR-related operations may be the same as when the offset values are determined to be −10 and +10.

FIG. 7B illustrates another example of an offset table including predetermined offset values based on cell count values. Referring to FIG. 7B, an offset table 221-2 may include offset values matching a cell count value x. Unlike the offset table 221-1, the offset table 221-2 may include a plurality of DRR groups including different numbers of groups. Referring to the example illustrated in FIG. 7B, a first DRR group may include two groups GR1 and GR2, and a second DRR group may include four groups GR1, GR2, GR3, and GR4.

For example, when a DRR command for a target wordline is received, the control logic 122 may perform a first read operation on an adjacent wordline based on a first specific read level (for example, Vrd4). In addition, the control logic 122 may obtain a cell count value for the adjacent wordline and provide the obtained cell count value to the controller 200.

The DRR offset manager 220 may select offset values, corresponding to the cell count value received from the nonvolatile memory device 100, from the offset table to determine offset values. Information on the determined offset values may be provided to the nonvolatile memory device 100.

In this case, according to an example embodiment, the nonvolatile memory device 100 may perform an operation to divide target memory cells into a number of groups corresponding to the number of offset values, based on the information received from the controller 200. For example, when information on the offset values is received from the controller 200, the control logic 122 may identify or confirm the number of offset values corresponding to the received information on the offset values and may determine whether to perform an additional read operation, other than the first read operation, and a number of times the additional read operation to be performed, based on the confirmed number of offset values.

In an example embodiment, referring to FIG. 7B, when the cell count value for the adjacent wordline received from the nonvolatile memory device 100 is within a range between 1000 and 2000, the information received from the controller 200 may indicate that the number of offset values is two, for example, offset values are selected from the first DRR group, including two groups GR1 and GR2. In this case, the control logic 122 may not perform an additional read operation, other than the first read operation. This is because the target memory cells may already be divided into two groups based on a result of the first read operation.

In this case, the control logic 122 may perform a second read operation (that is, calibrating a normal read level using offset values and combining results of read operations using the calibrated normal read levels) on the target wordline based on the offset values corresponding to the received information on the offset values and the result of the first read operation, as described above in FIG. 7A.

In an example embodiment, when the confirmed number of offset values is four, that is, when offset values are to be selected from the second DRR group, including four groups GR1 to GR4. In this case, the control logic 122 may perform two additional read operations to divide the target memory cells into four groups. For example, the control logic 122 may perform a third read operation on the adjacent memory cells based on a second specific read level (for example, Vrd2) and perform a fourth read operation on the adjacent memory cells based on a third specific read level (for example, Vrd6). For example, the second specific read level may be lower than the first specific read level, and the third specific read level higher than the first specific read level. In this case, the target memory cells may be divided into four groups based on the results of the additional read operations (for example, the third and fourth read operations) and the result of the first read operation.

Accordingly, the control logic 122 may perform a second read operation on the target wordline based on the offset values corresponding to the received information, the result of the first read operation, and the results of the additional read operations. For example, when the offset values corresponding to the received information are −10, −8, +8, and +9, the control logic 122 may calibrate a normal read level based on each of the offset values −10, −8, +8, and +9, and may perform a read operation on the target wordline based on each of the calibrated normal read levels. In addition, the control logic 122 may combine results of the read operations on the target wordline based on the result of the first read operation and the results of the additional read operations.

FIG. 7C illustrates an example of an offset table including predetermined offset values based on a value of the cell count value and a value of additional information. As described above, the DRR offset manager 220 may determine the offset values based on a cell count value for an adjacent wordline and a value of additional information (e.g., P/E cycle, a temperature, and a location of a wordline) corresponding to a time point at which the DRR operation is performed. To this end, referring to FIG. 7C, an offset table 221-3 may include offset values matching not only a cell count value x but also a P/E cycle y, a temperature z, and a location of a wordline. As a result, the DRR offset manager 220 may select offset values, corresponding to current degradation conditions (for example, the cell count value, the P/E cycle, the temperature, the location of the wordline, or the like), from the offset table to determine the offset values.

Figure 8:
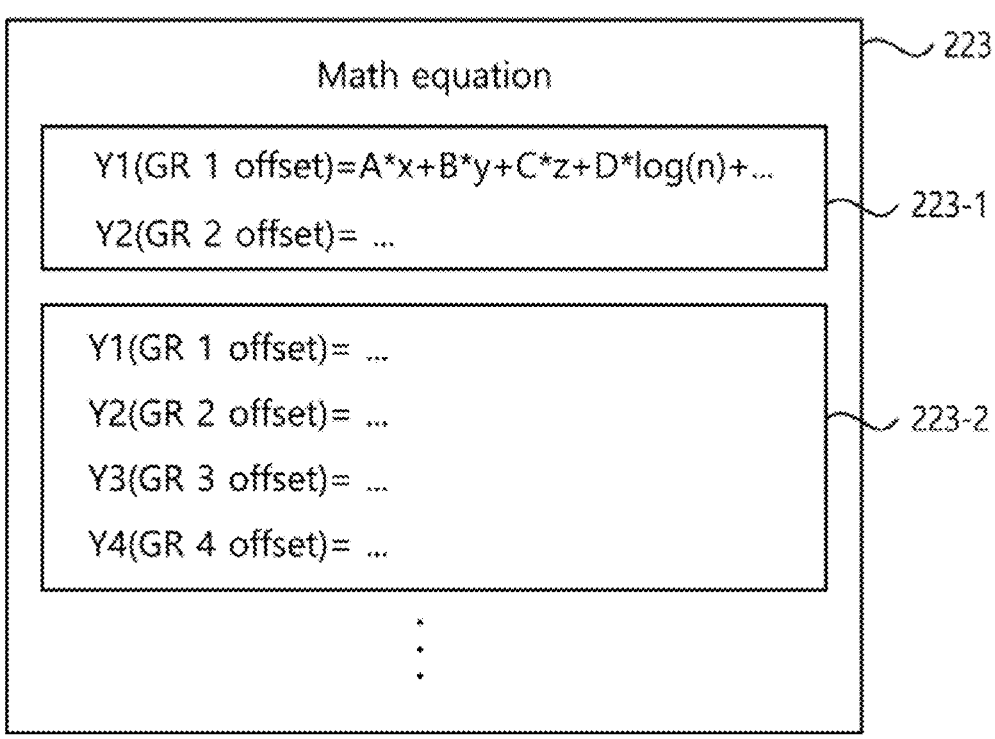
FIG. 8 is a diagram illustrating an algorithm or an equation according to an example embodiment.

FIG. 8 is a diagram illustrating an algorithm or an equation according to an example embodiment. Referring to FIG. 8, an equation 223 may include a first equation 223-1 corresponding to a first DRR group and a second equation 223-2 corresponding to a second DRR group. The first DRR group may include two groups GR1 and GR2, and the second DRR group may include four groups GR1, GR2, GR3, and GR4.

The first equation 223-1 may include an equation defining an offset value Y1 for a first group GR1 among two groups belonging to the first DRR group and an equation defining an offset value Y2 for a second group GR2 among the two groups belonging to the first DRR group. The second equation 223-2 may include an equation defining an offset value Y1 for a first group GR1 among four groups belonging to the second DRR group, an equation defining an offset value Y2 for a second group GR2 among the four groups belonging to the second DRR group, an equation defining an offset value Y3 for a third group GR3 among the four groups belonging to the second DRR group, and an equation defining an offset value Y4 for a fourth group GR4 among the four groups belonging to the second DRR group.

For example, the equation defining the offset value Y1 for the first group GR1 of the first equation 223-1 may be expressed as A*x+B*y+C*z+D*long(n)+ . . . , where "x" is a cell count value, "y" is a P/E cycle, "z" is a temperature, "n" is a location of a wordline, and " . . . " indicates that one or more additional degradation conditions may be included as variables in the equation. In the equation, A, B, C, and D may be constants derived by pre-training through machine learning. In a pre-training process, degradation conditions (for example, the cell count value, the P/E cycle, the temperature, the location of the wordline, or the like) and optimal offset values based on the degradation conditions may be used as training data. The remaining equations (e.g., the equation defining the offset value Y2 in the first equation 223-1, the equation defining the offset value Y1, Y2, Y3, or Y4 in the second equation 223-2) may be derived in the same manner, and thus may be included in the DRR offset manager 220.

As a result, the DRR offset manager 220 may determine the offset values by inputting the current degradation conditions (for example, the cell count value, the P/E cycle, the temperature, the location of the wordline, or the like) to the equation 223.

The equation 223 illustrated in FIG. 8 is only an example, and the form or number of the equations 223 is not limited to the example illustrated in FIG. 8.

Figure 9:
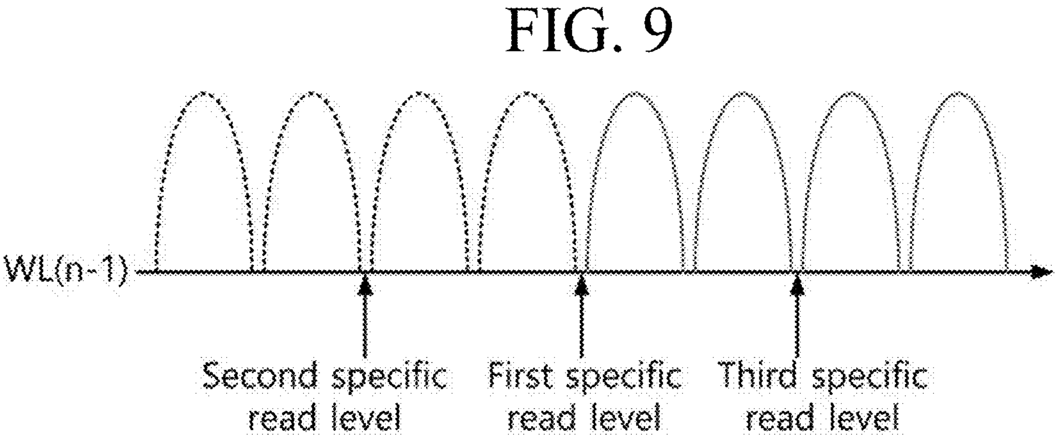
FIG. 9 is a diagram illustrating an additional read operation according to an example embodiment.

FIG. 9 is a diagram illustrating an additional read operation according to an example embodiment. FIG. 9 further illustrates specific read levels for the additional read operations in the example of FIG. 3.

Referring to FIG. 9, adjacent memory cells may be divided into two groups (e.g., ON-cell group and OFF-cell group) according to a first read operation that is performed based on a first specific read level. Then, when the number of offset values is identified or confirmed as four based on information received from the controller 200, the control logic 122 may perform two additional read operations. For example, the control logic 122 may perform a third read operation based on a second specific read level and perform a fourth read operation based on a third specific read level. The second specific read level may be lower than the first specific read level, and the third specific read level higher than the first specific read level. Accordingly, the adjacent memory cells may be divided into four groups. A group to which a target memory cell belongs is determined by a group to which adjacent memory cells sharing a bitline belong, and therefore, the target memory cells may also be divided into four groups.

The four offset values may correspond to four groups of target memory cells. Therefore, the control logic 122 may perform a read operation on the target word line based on each of the four offset values, and may combine results of the read operations on the target wordline based on results of first, third, and fourth read operations. Thus, based on the above operations, the second read operation of the target wordline may be performed.

FIG. 10 is a flowchart illustrating a DRR operation method of a nonvolatile memory system 1000 according to an example embodiment.

Refer to FIG. 10, in operation S1010, the nonvolatile memory system 1000 may perform a first read operation on adjacent memory cells connected to an adjacent wordline based on a first specific read level. The adjacent wordline may be a wordline programmed in the next sequence of a target wordline during a program operation, among wordlines adjacent to the target wordline, but example embodiments are not limited thereto. In addition, the first specific read level may be a normal read level corresponding to a specific program state, among a plurality of program states of adjacent memory cells.

In operation S1020, the nonvolatile memory system 1000 may obtain a cell count value for the adjacent wordline. The cell count value for the adjacent wordline may include at least one of an ON-cell count value for the number of turned-on adjacent memory cells, an OFF-cell count value for the number of turned-off adjacent memory cells, and a difference between the ON-cell count value and the OFF-cell count value.

For example, the nonvolatile memory system 1000 may obtain a cell count value for an adjacent wordline based on the first specific read level. In this case, the nonvolatile memory system 1000 may obtain a cell count value based on a result of the first read operation. Alternatively, the nonvolatile memory system 1000 may obtain a cell count value for an adjacent wordline corresponding to a predetermined read level range. In this case, the nonvolatile memory system 1000 may obtain the cell count value for the adjacent wordline based on an operation (for example, an HRR operation or an OVS operation), separate from the first read operation.

In operation S1030, the nonvolatile memory system 1000 may determine offset values to calibrate the normal read level corresponding to the target wordline based on the cell count value for the adjacent wordline. In an example embodiment, the nonvolatile memory system 1000 may determine the offset values based on the cell count value for the adjacent wordline and/or a value of additional information. The additional information may include at least one of program/erase (P/E) cycles of target memory cells connected to a target wordline, a temperature of the target memory cells, and a location of the target wordline.

For example, the nonvolatile memory system 1000 may determine the offset values based on a table including predetermined offset values in association with the cell count value and the value of the additional information. Alternatively, the nonvolatile memory system 1000 may determine the offset values based on an algorithm and/or an equation in which an offset value is determined depending on the cell count value and the value of the additional information. In this case, the equation may be derived in advance through machine learning based on training data including the cell count value, the value of the additional information, and the optimal offset value.

In operation S1040, the nonvolatile memory system 1000 may perform a second read operation on the target memory cells connected to the target wordline, based on a result of the first read operation and the determined offset values. For example, the nonvolatile memory system 1000 may perform a read operation on the target memory cells for each of the determined offset values, and may combine results of the read operations performed on each of the offset values based on the results of the first read operation.

In this case, each of the target memory cells may belong to one of a plurality of groups based on a program state of an adjacent memory cell sharing a bitline, and the offset values may correspond to the plurality of groups, respectively.

According to an example embodiment, the plurality of groups may be groups, included in a single DRR group, and the single DRR group may be selected, among a plurality of DRR groups including different numbers of groups, based on a cell count value for an adjacent wordline. For example, the plurality of DRR groups may include a first DRR group, including two groups distinguished based on a first specific read level, and a second DRR group including four groups distinguished based on three specific read levels. In this case, the three specific read levels may include a first specific read level, a second specific read level lower than the first specific read level, and a third specific read level higher than the first specific read level.

According to an example embodiment, the nonvolatile memory system 1000 may perform an operation to divide the target memory cells into a number of groups corresponding to the number of determined offset values. For example, the nonvolatile memory system 1000 may check the number of the determined offset values, and may determine whether to perform an additional read operation and how many times to perform the additional read operation, based on the checked number of the determined offset values.

In an example embodiment, in the case in which the number of the checked offset values is four, for example, in the case in which the second DRR group, including four groups distinguished based on the first to the third specific read levels, is selected from among the first and the second DRR groups, the nonvolatile memory system 1000 may perform additional third and fourth read operations on adjacent memory cells based on the second and the third specific read levels, respectively.

FIG. 11 is a flowchart illustrating a method of operating the nonvolatile memory system 1000 according to an example embodiment. Referring to FIG. 11, in operation S1110, the nonvolatile memory system 1000 may perform a normal read operation based on a normal read level for target memory cells connected to a target wordline.

In operation S1120, the nonvolatile memory system 1000 may determine whether an uncorrectable error correction code (UECC) has been generated, based on a result of the normal read operation on the target memory cells. For example, the nonvolatile memory system 1000 may determine that the UECC has been generated when a number of error bits (or fail bits) is greater than or equal to a predetermined number, but example embodiments are not limited thereto.

When it is determined that the UECC has been generated, the nonvolatile memory system 1000 may perform the DRR operation, described in FIG. 10, on the target memory cells (e.g., proceed to S1010 in FIG. 10).

Figure 12:
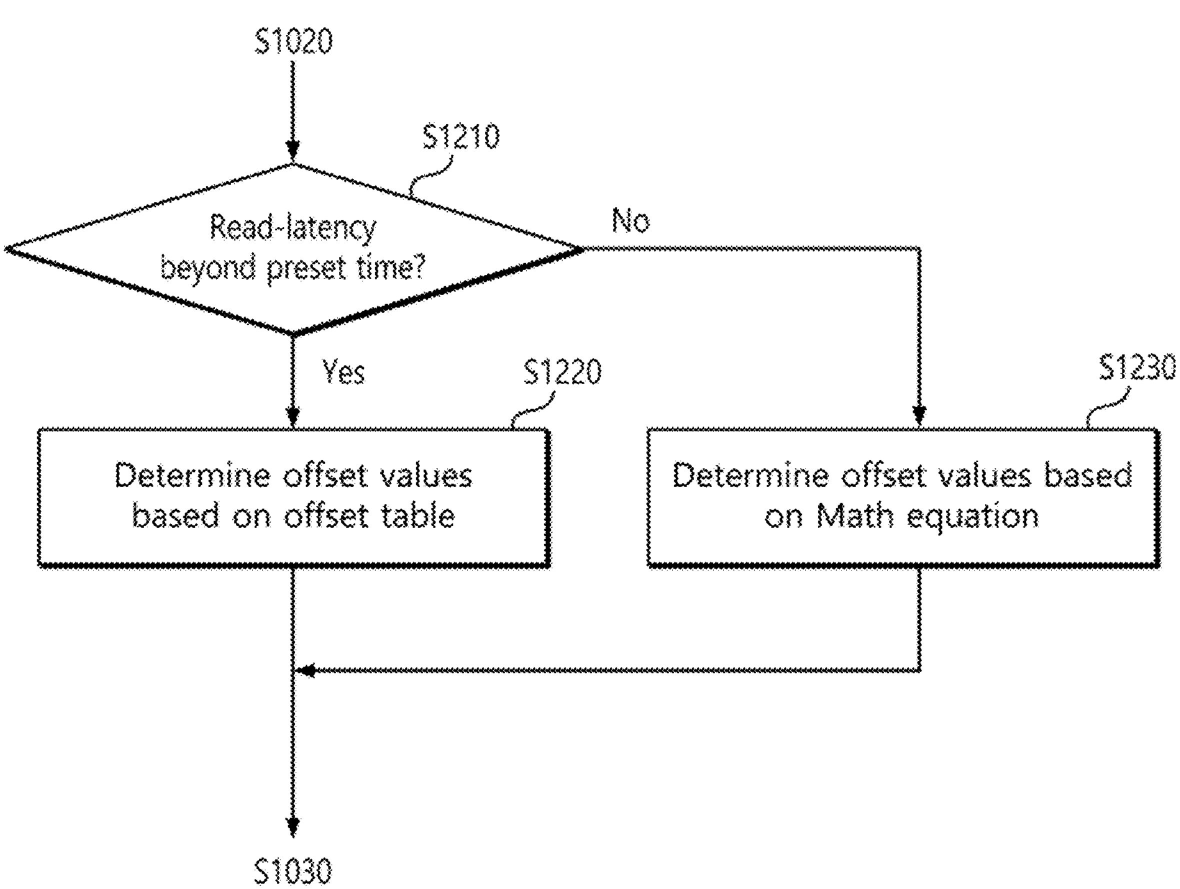
FIG. 12 is a flowchart illustrating a method of operating a nonvolatile memory system according to an example embodiment.

FIG. 12 is a flowchart illustrating a method of operating the nonvolatile memory system 1000 according to an example embodiment.

According to an example embodiment, the nonvolatile memory system 1000 may include both the offset table 221 and the equation 223. In this case, using the equation 223 may result in determining a more optimal offset value than using the offset table 221, but a relatively large amount of time is required to determine an offset value. According to an example embodiment, the nonvolatile memory system 1000 may select one of the offset table 221 and the equation 223 based on read latency, and may determine offset values using the selected one of the offset table 221 and the equation 223.

Referring to FIG. 12, in operation S1210, the nonvolatile memory system 1000 determine whether the read latency exceeds a predetermined time. In this case, the read latency may be, for example, a time from an issuance of a normal read command for a target wordline to a present time, or a time from an issuance of a DRR command for a target wordline to the present time, but example embodiments are not limited thereto.

When the read latency exceeds the predetermined time (Yes to S1210), the flow proceeds to operation S1220 in which the nonvolatile memory system 1000 may determine the offset values, based on the offset table 221. When the read latency does not exceed the predetermined time (No to S1210), the flow proceeds to operation S1230 in which the nonvolatile memory system 1000 may determine the offset values, based on the equation 223.

Figure 13:
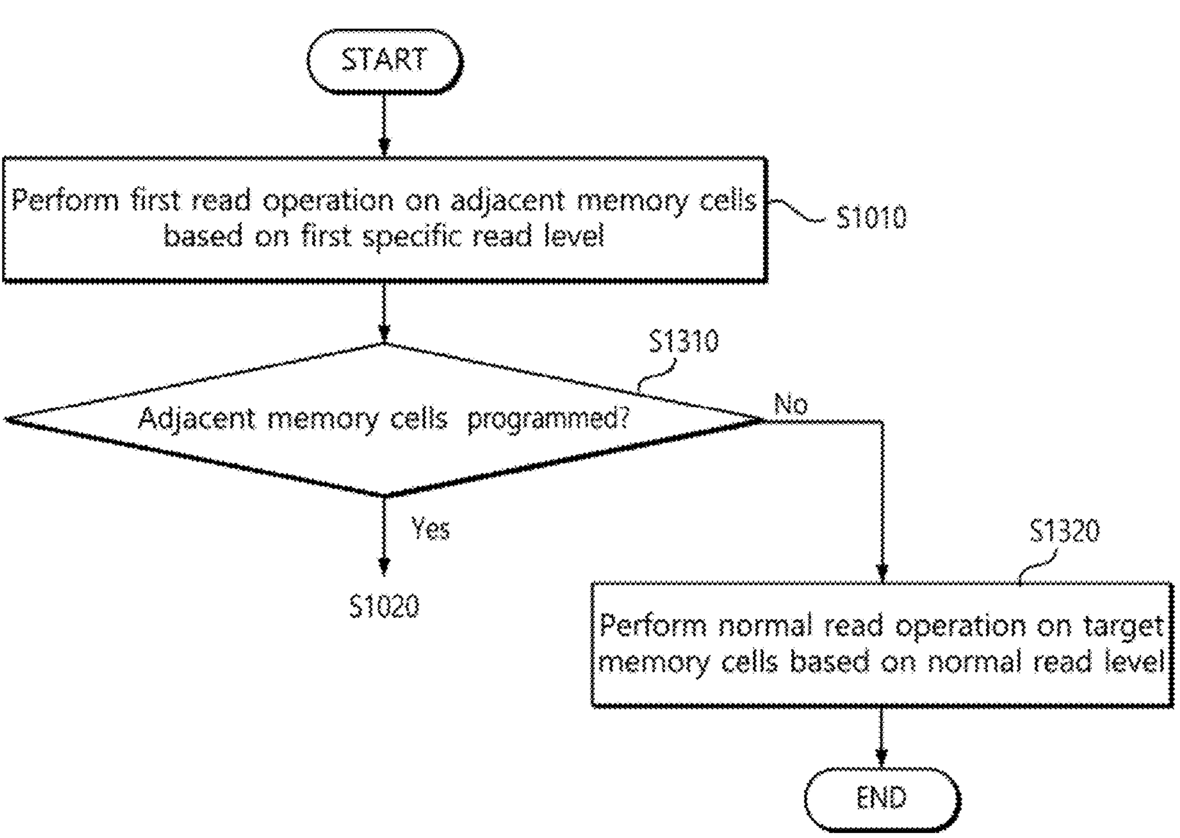
FIG. 13 is a flowchart illustrating a method of operating a nonvolatile memory system according to an example embodiment.

FIG. 13 is a flowchart illustrating a method of operating a nonvolatile memory system 1000 according to an example embodiment.

For example, when adjacent memory cells are not in a programmed state, it may indicate there is no interference to distribution of target memory cells due to a program operation, and thus, the DRR operation does not need to be performed on the target memory cells. Therefore, in an example embodiment, the nonvolatile memory system 1000 may check a program state of the adjacent memory cells after performing a first read operation, and may determine whether to continuously perform the DRR operation, based on a result of the checking.

Referring to FIG. 13, in operation S1010, the nonvolatile memory system 1000 may perform a first read operation on adjacent memory cells connected to adjacent wordlines based on a first specific read level. Operation S1010 in FIG. 13 may be understood as the same or substantially the same as operation S1010 in FIG. 10.

In operation S1310, the nonvolatile memory system 1000 may determine whether adjacent memory cells are in a programmed state.

When the adjacent memory cells are in the programmed state (Yes to S1310), the flow proceeds to operation S1020 of FIG. 10 in which the nonvolatile memory system 1000 may obtain a cell count value for the adjacent wordline.

When the adjacent memory cells are not in the programmed state (No to S1310), the flow proceeds to operation S1320 in which the nonvolatile memory system 1000 may perform a normal read operation on the target memory cells based on the normal read level for the target wordline.

Figure 14:
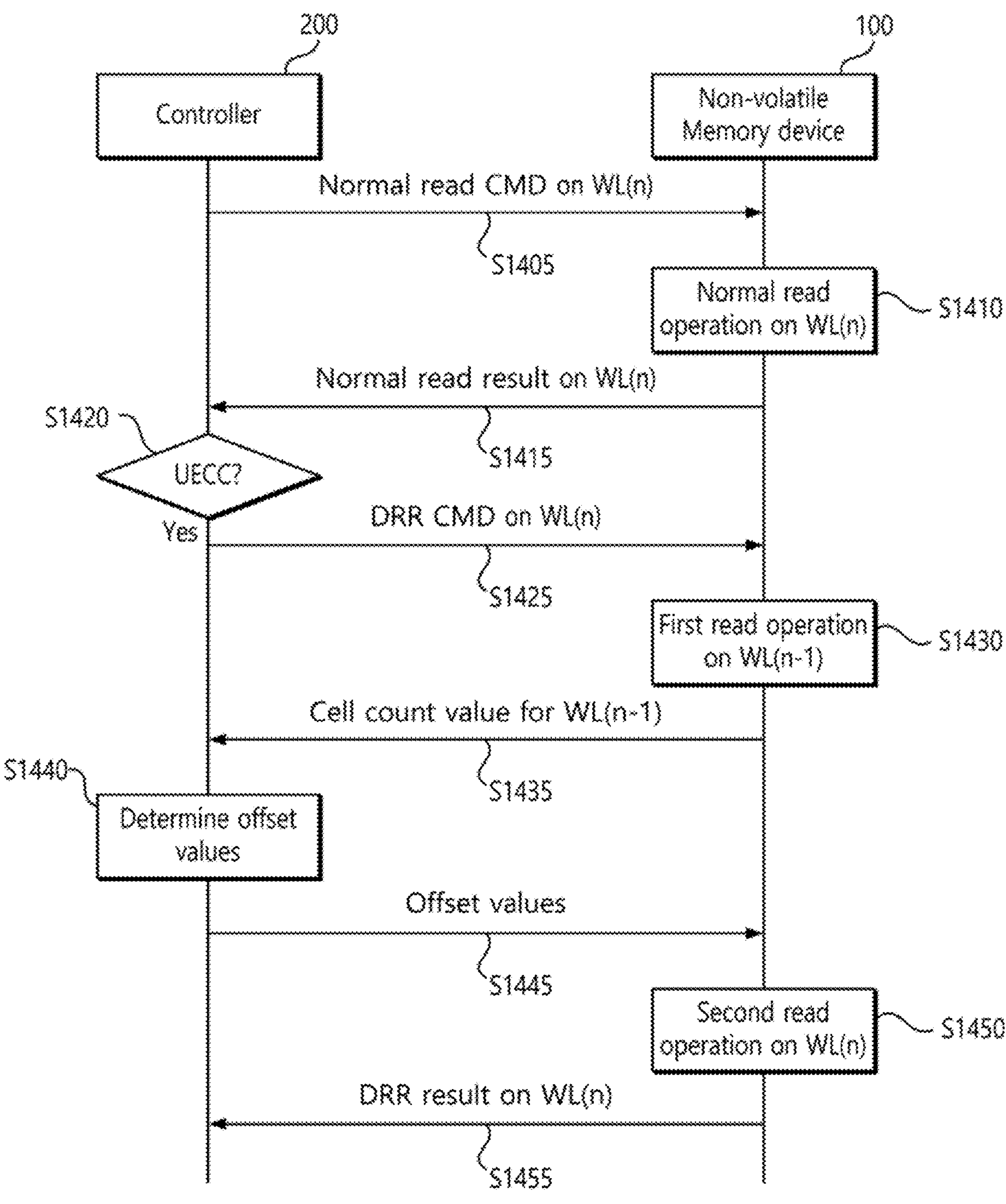
FIG. 14 is a ladder diagram illustrating a method of operating a nonvolatile memory system according to an example embodiment.

FIG. 14 is a ladder diagram illustrating a method of operating the nonvolatile memory system 1000 according to an example embodiment. In FIG. 14, WL(n) represents a target wordline and WL(n−1) represents an adjacent wordline. In FIG. 14, redundant descriptions will be omitted.

Referring to FIG. 14, in operation S1405, the controller 200 may transmit a normal read command for the target wordline WL(n) to the nonvolatile memory device 100. Accordingly, in operation S1410, the nonvolatile memory device 100 may perform a normal read operation on the target wordline WL(n) based on a normal read level for the target wordline WL(n). In operation S1415, the nonvolatile memory device 100 may transmit a result of the normal read operation on the target wordline WL(n) to the controller 200.

In operation S1420, the controller 200 may determine whether UECC has been generated, based on the normal read result. When the UECC is generated (Yes to S1420), the flow proceeds to operation S1425 in which the controller 200 may transmit a DRR command for the target wordline WL(n) to the nonvolatile memory device 100.

Accordingly, in operation S1430, the nonvolatile memory device 100 may perform a first read operation on the adjacent wordline WL(n−1) based on a first specific read level. The nonvolatile memory device 100 may obtain a cell count value for the adjacent wordline WL(n−1). In operation S1435, the nonvolatile memory device 100 may transmit the obtained cell count value to the controller 200.

In operation S1440, the controller 200 may determine offset values for calibrating the normal read level for the target wordline WL(n) based on the cell count value. In this case, the controller 200 may determine the offset values based on the offset table 221 or the pre-stored equation 223. In operation S1445, the controller 200 may transmit the determined offset values to the nonvolatile memory device 100.

In operation S1450, the nonvolatile memory device 100 may perform a second read operation on the target wordline WL(n) based on the result of the first read operation and the offset values received from the controller 200. For example, the nonvolatile memory device 100 may calibrate the normal read level for the target wordline WL(n) based on each of the determined offset values, and may perform a read operation on the target wordline WL(n) based on each of the calibrated normal read levels. In addition, the nonvolatile memory device 100 may combine the results of the read operations, performed on the target wordline based on the each of the calibrated normal read levels, based on the result of the first read operation.

Accordingly, in operation S1455, the nonvolatile memory device 100 may transmit a DRR result for the target wordline WL(n) to the controller. In this case, the DRR result may be a result of the second read operation, but example embodiments are not limited thereto.

In the above-described examples, for example, when the target wordline is WL(n) and program operations are performed in a sequence of WL(n+1), WL(n), and WL(n−1), the first read operation is performed only on the adjacent wordline, for example WL(n−1), programmed in the next sequence of the target word line WL(n). However, example embodiments are not limited thereto.

According to an example embodiment, a first read operation may be performed on an adjacent wordline, programmed before the target wordline WL(n), for example, WL(n+1), based on a first specific read level and a DRR operation may be performed using results of the first read operation on WL(n−1) and WL(n+1). Such an embodiment will be described below with reference to FIGS. 15A and 15B.

Figure 15A:
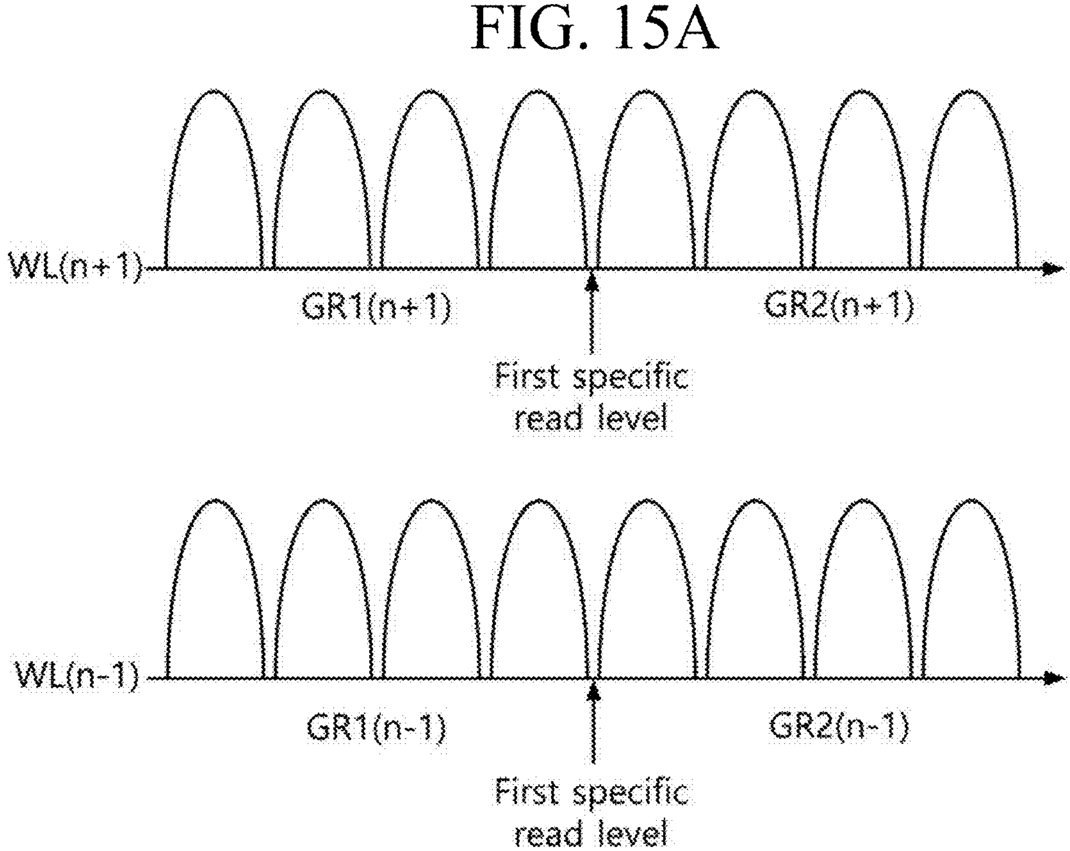
FIG. 15A is a diagram illustrating a DRR operation of a nonvolatile memory system according to an example embodiment.

FIGS. 15A and 15B are diagrams illustrating a DRR operation of the nonvolatile memory system 1000 according to an example embodiment.

According to an example embodiment, the nonvolatile memory device 100 may perform a first read operation on not only an adjacent wordline WL(n−1) but also an adjacent wordline WL(n+1) based on a first specific read level, as illustrated in FIG. 15A. Accordingly, adjacent memory cells of WL(n−1) may be divided into two groups, such as GR1($n$−1) and GR2($n$−1), with respect to the first specific read level. In addition, adjacent memory cells of WL(n+1) may also be divided into two groups, such as GR1(*n*+1) and GR2(*n*+1), with respect to the first specific read level.

In this case, target memory cells connected to WL(n) may be divided into four groups by a combination of a group, to which adjacent memory cells of WL(n−1) belong, and a group to which adjacent memory cells of WL(n+1) belong. Accordingly, offset values may also be set to be subdivided into four offset values.

FIG. 15B illustrate an example of an offset table including four offset values applied to target memory cells divided into four groups. Referring to an offset table 221-4 of FIG. 15B, it can be seen that four offset values are each matched based on a cell count value. Specifically, the offset table 221-4 include offset values for target memory cells corresponding to a first case in which adjacent memory cells of WL(n−1) belong to a group GR1 and adjacent memory cells of WL(n+1) belong to the group GR1 (that is, adjacent memory cells of WL(n−1) and WL(n+1) are turned off based on the first specific read level); a second case in which the adjacent memory cells of WL(n−1) belong to the group GR1 and adjacent memory cells of WL(n+1) belong to a group GR2 (that is, adjacent memory cells of WL(n−1) are turned off and adjacent memory cells of WL(n+1) are turned on based on the first specific read level); a third case in which the adjacent memory cells of WL(n−1) belong to the group GR2 and the adjacent memory cells of WL(n+1) belong to the group GR1 (that is, adjacent memory cells of WL(n−1) are turned on and adjacent memory cells of WL(n+1) are turned off based on the first specific read level); and a fourth case in which the adjacent memory cells of WL(n−1) belong to the group GR2 and the adjacent memory cells of WL(n+1) belong to the group GR2 (that is, adjacent memory cells of WL(n−1) and WL(n+1) are turned on based on the first specific read level).

Accordingly, the controller 200 may determine offset values in the offset table 221-4 as illustrated in FIG. 15B, based on the cell count value received from the nonvolatile memory device 100. In this case, the cell count value received from the nonvolatile memory device 100 may be a cell count value for WL(n−1), but example embodiments are not limited thereto.

When the determined offset values are received from the controller 200, the nonvolatile memory device 100 may perform a second read operation on WL(n) based on a result of the first read operation on WL(n−1), a result of the first read operation on WL(n+1), and the received offset values.

For example, the nonvolatile memory device 100 may calibrate a normal read level based on each of the four offset values determined in the offset table of FIG. 15B, and may perform a read operation on WL(n) based on the calibrated normal read levels. In this case, four read operation results for WL(n) may be generated. The nonvolatile memory device 100 may identify which of the four groups the target memory cells belong to, based on the results of the first read operation on WL(n−1) and the results of the first read operation on WL(n+1). Accordingly, the nonvolatile memory device 100 may perform a second read operation by combining the results of four read operations on WL(n) based on the results of the first read operation on WL(n−1) and the results of the first read operation on WL(n+1).

For example, when memory cells in a programmed state are left in a high-temperature environment, a distribution of WL(n) may be degraded due to lateral spreading of WL(n−1) and WL(n+1). However, as described above, an offset value may be determined in consideration of all degradation states of adjacent wordlines adjacent to a target wordline above and below, and thus optimal offset values may be determined even in such a case.

Although FIG. 15B illustrates an example in which the controller 200 determines offset values using the offset table 221-4, example embodiments are not limited thereto. For example, the controller 200 may store an equation 223 derived in advance through machine learning using distribution data of WL(n−1) and WL(n+1) as training data, and may determine an offset value using the stored equation 223. In addition, although FIG. 15B illustrates a cell count value as a variable, a plurality of pieces of additional information described above may be further included in the offset table 224-1 or the equation 224 as variables for determining the offset values.

As set forth above, according to example embodiments, read latency may be reduced during a DRR operation and reliability of the DRR operation may be improved.

According to an example embodiment, operation methods according to various embodiments may be included and provided in a computer program product. The computer program product may be traded as a product between a seller and a buyer. The computer program product may be distributed in the form of a machine-readable storage medium (for example, compact disc read only memory (CD-ROM)), or be distributed (for example, downloaded or uploaded) online via an application store (for example, PlayStore™), or between two user devices (for example, smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (for example, a module or a program) of the above-described components may include a single entity or multiple entities. According to various embodiments, one or more of the above-described components may be omitted, or one or more other components may be added. Alternatively or additionally, a plurality of components (for example, modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

At least one of the components, elements, modules or units described herein may be embodied as various numbers of hardware, software and/or firmware structures that execute respective functions described above, according to an example embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the block diagrams, communication between the components, elements or units may be performed through the bus. Functional aspects of the above example embodiments may be implemented in algorithms that execute on one or more processors. Furthermore, the components, elements or units represented by a block or processing operations may employ any number of related art techniques for electronics configuration, signal processing and/or control, data processing and the like.

While example embodiments have been shown and described above, it will be apparent to those skilled in the art that modifications and variations can be made without departing from the scope of the present inventive concept as defined by the appended claims and their equivalents.

What is claimed is:

1. A data recover read (DRR) operation method of a nonvolatile memory system, the DRR operation method comprising:

performing a first read operation on adjacent memory cells, which are connected to an adjacent wordline adjacent to a target wordline, based on a first specific read level;

obtaining a cell count value for the adjacent wordline;

determining offset values for a normal read level of target memory cells, which are connected to the target wordline, by using at least one of an offset table or an algorithm, which defines an optimal offset value based on the cell count value for the adjacent wordline, as a first variable, and further based on a value of additional information, as a second variable; and performing a second read operation on the target memory cells, based on the determined offset values and a result of the first read operation, wherein the additional information comprises at least one of a program/erase (P/E) cycle of the target memory cells, temperature of the target memory cells, or a location of the target wordline, and wherein the offset table includes a plurality of predetermined offset values that respectively match with preset values of the cell count value and at least one of preset values of the P/E cycle of the target memory cells, preset values of the temperature of the target memory cells, or preset values of the location of the target wordline.

2. The DRR operation method of claim 1, wherein the first specific read level is a normal read level corresponding to a specific program state, among a plurality of program states, of the adjacent memory cells.

3. The DRR operation method of claim 1, wherein the cell count value for the adjacent wordline comprises at least one of an ON-cell count value related to a number of turned-on adjacent memory cells, an OFF-cell count value related to a number of turned-off adjacent memory cells, or a difference value between the ON-cell count value and the OFF-cell count value.

4. The DRR operation method of claim 1, wherein the determining the offset values comprises determining the offset values based on the offset table, the offset table comprising optimal offset values that respectively match cell count values and values of the additional information.

5. The DRR operation method of claim 1, wherein the determining the offset values comprises determining the offset values based on the algorithm, and wherein the algorithm is derived through machine learning based on training data, the training data comprising the cell count value, the value of the additional information, and the optimal offset value.

6. The DRR operation method of claim 1, wherein each of the target memory cells belongs to a single group, among a plurality of groups, based on a program state of an adjacent memory cell sharing a bitline with a corresponding target memory cell, and wherein the determined offset values correspond to the plurality of groups, respectively.

7. The DRR operation method of claim 6, wherein the plurality of groups belong to a single DRR group, which is selected based on the cell count value for the adjacent wordline, among a plurality of DRR groups including different numbers of groups.

8. The DRR operation method of claim 7, wherein the plurality of DRR groups comprises a first DRR group and a second DRR group, the first DRR group comprising two groups distinguished with each other with respect to the first specific read level, and the second DRR group comprising four groups distinguished with one another with respect to three specific read levels, and wherein the three specific read levels comprise the first specific read level, a second specific read level lower than the first specific read level, and a third specific read level higher than the first specific read level.

9. The DRR operation method of claim 8, further comprising, based on the second DRR group being selected:

performing a third read operation based on the second specific read level on the adjacent memory cells and performing a fourth read operation on the adjacent memory cells based on the third specific read level on the adjacent memory cells.

10. The DRR operation method of claim 1, wherein the performing the second read operation comprises:

performing a read operation on the target memory cells based on each of the determined offset values; and combining results of read operations performed based on the each of the determined offset values, based on the result of the first read operation.

11. The DRR operation method of claim 1, wherein the adjacent wordline is a wordline programmed in a sequence next to the target wordline during a program operation, among wordlines adjacent to the target wordline.

12. The DRR operation method of claim 1, wherein the DRR operation method is performed based on an uncorrectable error correction code (UECC) being generated in a normal read operation performed on the target memory cells.

13. A nonvolatile memory system comprising:

a nonvolatile memory device comprising target memory cells, connected to a target wordline, and adjacent memory cells connected to an adjacent wordline adjacent to the target wordline; and a controller configured to control an operation of the nonvolatile memory device, wherein the nonvolatile memory device is configured to perform a first read operation on the adjacent memory cells based on a specific read level and configured to obtain a cell count value for the adjacent wordline, wherein the controller is configured to determine offset values for calibrating a normal read level of the target memory cells, by using at least one of an offset table or an algorithm, which defines an optimal offset value based on the cell count value for the adjacent wordline, as a first variable, and further based on a value of additional information, as a second variable, and configured to control the nonvolatile memory device to perform a second read operation on the target memory cells based on the determined offset values and a result of the first read operation, wherein the additional information comprises at least one of a program/erase (P/E) cycle of the target memory cells, temperature of the target memory cells, or a location of the target wordline, and wherein the offset table includes a plurality of predetermined offset values that respectively match with preset values of the cell count value and at least one of preset values of the P/E cycle of the target memory cells, preset values of the temperature of the target memory cells, or preset values of the location of the target wordline.

14. The nonvolatile memory system of claim 13, wherein the specific read level is a normal read level corresponding to a specific program state, among a plurality of program states of the adjacent memory cells, and wherein the cell count value for the adjacent wordline comprises at least one of an ON-cell count value related to a number of turned-on adjacent memory cells, an OFF-cell count value related to a number of turned-off adjacent memory cells, or a difference value between the ON-cell count value and the OFF-cell count value.

15. The nonvolatile memory system of claim 13, wherein the controller is further configured to determine the offset values based on the offset table, the offset table comprising optimal offset values that respectively match cell count values and values of the additional information.

16. The nonvolatile memory system of claim 13, wherein the controller is further configured to determine the offset values based on the algorithm, and wherein the algorithm is derived through machine learning based on training data, the training data comprising the cell count value, the value of the additional information, and the optimal offset value.

17. The nonvolatile memory system of claim 13, wherein each of the target memory cells belongs to a single group, among a plurality of groups, based on a program state of an adjacent memory cell sharing a bitline with a corresponding target memory cell, and wherein the determined offset values correspond to the plurality of groups, respectively.

18. A nonvolatile memory device comprising:

a memory cell array comprising target memory cells, connected to a target wordline, and adjacent memory cells connected to an adjacent wordline adjacent to the target wordline; and a control logic configured to perform a first read operation based on a specific read level and configured to obtain a cell count value for the adjacent wordline, wherein the control logic performs a second read operation on the target memory cells, based on offset values for calibrating a normal read level of target memory cells and a result of the first read operation, wherein the offset values are determined by using at least one of an offset table or an algorithm, which defines an optimal offset value based on the cell count value for the adjacent wordline, as a first variable, and further based on a value of additional information, as a second variable, wherein the additional information comprises at least one of a program/erase (P/E) cycle of the target memory cells, temperature of the target memory cells, or a location of the target wordline, and wherein the offset table includes a plurality of predetermined offset values that respectively match with preset values of the cell count value and at least one of preset values of the P/E cycle of the target memory cells, preset values of the temperature of the target memory cells, or preset values of the location of the target wordline.

* * * * *